(12) United States Patent
Liao et al.

(10) Patent No.: US 11,910,669 B2
(45) Date of Patent: Feb. 20, 2024

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Maoying Liao, Beijing (CN); Yang Zhou, Beijing (CN); Xin Zhang, Beijing (CN); Huijuan Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 138 days.

(21) Appl. No.: 17/428,979

(22) PCT Filed: Oct. 30, 2020

(86) PCT No.: PCT/CN2020/125180
§ 371 (c)(1),
(2) Date: Aug. 6, 2021

(87) PCT Pub. No.: WO2022/088021
PCT Pub. Date: May 5, 2022

(65) Prior Publication Data
US 2022/0352287 A1    Nov. 3, 2022

(51) Int. Cl.
*H10K 59/40*  (2023.01)
*G09G 3/3291*  (2016.01)
(Continued)

(52) U.S. Cl.
CPC ......... *H10K 59/131* (2023.02); *G09G 3/3258* (2013.01); *G09G 2300/0426* (2013.01); *G09G 2300/0842* (2013.01)

(58) Field of Classification Search
CPC ............... H10K 59/131; G09G 3/3258; G09G 2300/0426; G09G 2300/0842
See application file for complete search history.

(56) References Cited

U.S. PATENT DOCUMENTS

| 2011/0128276 A1 | 6/2011 | Toyomura et al. |
| 2014/0167009 A1 | 6/2014 | Lee et al. |
| (Continued) | | |

FOREIGN PATENT DOCUMENTS

| CN | 107479258 A | 12/2017 |
| CN | 108628047 A | 10/2018 |
| (Continued) | | |

OTHER PUBLICATIONS

International Search Report & Written Opinion dated Jul. 26, 2021, regarding PCT/CN2020/125180.

*Primary Examiner* — Lin Li
(74) *Attorney, Agent, or Firm* — Intellectual Valley Law, P.C.

(57) ABSTRACT

An array substrate is provided. The array substrate includes a node connecting line in a same layer as a respective one of the plurality of voltage supply lines, connected to a first capacitor electrode through a first via, and connected to a semiconductor material layer through a second via; and an interference preventing block in a same layer as the second capacitor electrode. The respective one of the plurality of voltage supply lines is connected to the interference preventing block through a third via. The interference preventing block includes a first arm and a second arm. Along the first direction, a portion of the node connecting line at a position connecting to the semiconductor material layer through the second via is spaced apart from a first adjacent data line by the first arm, and is spaced apart from a second adjacent data line by the second arm.

18 Claims, 19 Drawing Sheets

(51) Int. Cl.
  *H10K 59/131* (2023.01)
  *H10K 59/124* (2023.01)
  *H10K 59/121* (2023.01)
  *H01L 27/12* (2006.01)
  *G09G 3/3258* (2016.01)

(56) References Cited

U.S. PATENT DOCUMENTS

| | | | |
|---|---|---|---|
| 2016/0064411 A1* | 3/2016 | Park | H01L 27/124 257/89 |
| 2017/0330928 A1 | 11/2017 | Choi et al. | |
| 2018/0190750 A1* | 7/2018 | Choi | H10K 59/1213 |
| 2019/0050100 A1 | 2/2019 | Ma et al. | |
| 2019/0267440 A1* | 8/2019 | Park | G09G 3/3291 |
| 2020/0013337 A1* | 1/2020 | Cho | H10K 71/80 |
| 2020/0105849 A1 | 4/2020 | Kim et al. | |
| 2020/0194529 A1 | 6/2020 | Lee et al. | |
| 2020/0411611 A1 | 12/2020 | Liu et al. | |
| 2021/0066436 A1* | 3/2021 | Shim | H10K 59/40 |
| 2021/0151540 A1 | 5/2021 | Wang | |
| 2021/0202633 A1* | 7/2021 | Song | H10K 59/124 |
| 2021/0272523 A1 | 9/2021 | Cheng | |
| 2021/0328000 A1 | 10/2021 | Jia et al. | |
| 2021/0335953 A1* | 10/2021 | Kim | H10K 59/131 |
| 2022/0123089 A1* | 4/2022 | Shang | G09G 3/3266 |

FOREIGN PATENT DOCUMENTS

| | | |
|---|---|---|
| CN | 110114885 A | 8/2019 |
| CN | 110197647 A | 9/2019 |
| CN | 110265458 A | 9/2019 |
| CN | 110299384 A | 10/2019 |
| CN | 110690360 A | 1/2020 |
| CN | 110970469 A | 4/2020 |
| CN | 210607257 U | 5/2020 |
| CN | 111326527 A | 6/2020 |
| CN | 111754936 A | 10/2020 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2020/125180, filed Oct. 30, 2020, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of gate lines respectively extending along a first direction; a plurality of data lines respectively extending along a second direction; a plurality of voltage supply lines respectively extending along the second direction; and a pixel driving circuit; wherein the pixel driving circuit comprises a driving transistor; a first transistor; a second transistor; a third transistor, and a storage capacitor; and the storage capacitor comprises a first capacitor electrode, a second capacitor electrode electrically connected to a respective one of the plurality of voltage supply lines, and an insulating layer between the first capacitor electrode and the second capacitor electrode; wherein the array substrate comprises a semiconductor material layer on a base substrate; a node connecting line in a same layer as the respective one of the plurality of voltage supply lines, connected to the first capacitor electrode through a first via, and connected to the semiconductor material layer through a second via; and an interference preventing block in a same layer as the second capacitor electrode, the respective one of the plurality of voltage supply lines connected to the interference preventing block through a third via, the interference preventing block comprising a first arm and a second arm; wherein, along the first direction, a portion of the node connecting line at a position connecting to the semiconductor material layer through the second via is spaced apart from a first adjacent data line by the first arm, and is spaced apart from a second adjacent data line by the second arm.

Optionally, a first electrode of the third transistor and a second electrode of the first transistor are parts of a unitary structure in a respective one of a plurality of subpixels; the node connecting line is connected to the first electrode of the third transistor through the second via; and an orthographic projection of the first arm on a base substrate at least partially overlaps with an orthographic projection of the active layer of third transistor on the base substrate.

Optionally, an orthographic projection of the second arm on a base substrate at least partially overlaps with an orthographic projection of a respective one of the plurality of voltage supply lines on the base substrate.

Optionally, an orthographic projection of a respective one of the plurality of voltage supply lines on the base substrate substantially covers at least 30% of an orthographic projection of the second arm on the base substrate.

Optionally, the interference preventing block further comprises a handle; the respective one of the plurality of voltage supply lines is connected to the handle through the third via; the first arm comprises a L-shaped portion and a first tip portion; and the second arm comprises a base portion, a second tip portion, and a connecting portion connecting the base portion and the second tip portion; wherein the base portion connects the L-shaped portion and the handle.

Optionally, a first electrode and an active layer of the third transistor are parts of a unitary structure in a respective one of a plurality of subpixels; the node connecting line is connected to the first electrode of the third transistor or to a second electrode of the first transistor through the second via; and an orthographic projection of the first tip portion on a base substrate at least partially overlaps with an orthographic projection of the active layer of third transistor on the base substrate.

Optionally, a respective one of the plurality of voltage supply lines comprises a first parallel portion, a second parallel portion, and an inclined portion connecting the first parallel portion and the second parallel portion along an inclined direction; the first parallel portion and the second parallel portion respectively extend along a direction substantially parallel to the second direction; the inclined portion extends along an inclined angle with respect to the second direction; the handle and the base portion are arranged along a direction substantially parallel to the second direction; and the connecting portion extends along a direction substantially parallel to the inclined direction.

Optionally, an orthographic projection of the inclined portion on a base substrate substantially covers an orthographic projection of the connecting portion on the base substrate; an orthographic projection of the first parallel portion on the base substrate at least partially overlaps with an orthographic projection of the handle on the base substrate; and an orthographic projection of the second parallel portion on the base substrate substantially covers an orthographic projection of the second tip portion on the base substrate.

Optionally, a second electrode of the first transistor and a first electrode of the third transistor are parts of a unitary structure in a respective one of a plurality of subpixels, the second electrode of the first transistor directly connected to the first electrode of the third transistor; the node connecting line is connected to the first electrode of the third transistor through the second via; and an orthographic projection of the second electrode of the first transistor on a base substrate at least partially overlaps with an orthographic projection of the handle on the base substrate, at least partially overlaps with an orthographic projection of the first parallel portion on the base substrate, and at least partially overlaps with an orthographic projection of the base portion on the base substrate.

Optionally, an orthographic projection of the interference preventing block on the base substrate covers at least 30% of the orthographic projection of the second electrode of the first transistor on the base substrate.

Optionally, an orthographic projection of the portion of the node connecting line at the position connecting to the semiconductor material layer through the second via on a base substrate is substantially surrounded by a combination of an orthographic projection of the interference preventing block on the base substrate and an orthographic projection of a respective one of the plurality of gate lines on the base substrate.

Optionally, the array substrate further comprises a plurality of first reset control signal lines; a portion of a respective one of the plurality of first reset control signal lines functions as a gate electrode of the first transistor; a second electrode of the first transistor and a first electrode of the third transistor are parts of a unitary structure in a respective one of a plurality of subpixels, the second electrode of the first transistor directly connected to the first electrode of the third transistor; the node connecting line is connected to the first electrode of the third transistor through the second via; a portion of a respective one of the plurality of gate lines functions as a gate electrode of the third transistor; and an orthographic projection of the interference preventing block on the base substrate is surrounded by a combination of an orthographic projection of the first adjacent data line on the base substrate, an orthographic projection of the second adjacent data line on the base substrate, an orthographic projection of the respective one of the plurality of first reset control signal lines on the base substrate, and an orthographic projection of the respective one of the plurality of gate lines on the base substrate.

Optionally, a virtual line crossing over the portion of the node connecting line at the position connecting to the semiconductor material layer through the second via and substantially parallel to the first direction also crosses over the first tip portion, the second tip portion, the first adjacent data line, and the second adjacent data line.

Optionally, a first shortest distance, along the virtual line, between the portion of the node connecting line at the position connecting to the semiconductor material layer through the second via and a first center line along the second direction of the first adjacent data line is in a range of 10.0 μm to 20.0 μm.

Optionally, a second shortest distance, along the virtual line, between the portion of the node connecting line at the position connecting to the semiconductor material layer through the second via and an edge of the second parallel portion on a side closer to the second adjacent data line is in a range of 8.0 μm to 18.0 μm.

Optionally, a third shortest distance between a second center line along the second direction of the second adjacent data line and a third center line along the second direction of the handle is in a range of 11.0 μm to 22.0 μm.

Optionally, a ratio among the first shortest distance, the second shortest distance, and the third shortest distance is in a range of (14.5 to 16.5):(13.5 to 14.5):(16.0 to 18.0).

Optionally, the second adjacent data line is configured provide a data signal to a respective subpixel; and the first adjacent data line is configured to provide a data signal to an adjacent subpixel directly adjacent to the respective subpixel.

In another aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of gate lines respectively extending along a first direction; a plurality of data lines respectively extending along a second direction; a plurality of voltage supply lines respectively extending along the second direction; and a pixel driving circuit. Optionally, the pixel driving circuit includes a driving transistor; a first transistor; a second transistor; a third transistor, and a storage capacitor. Optionally, the storage capacitor comprises a first capacitor electrode, a second capacitor electrode electrically connected to a respective one of the plurality of voltage supply lines, and an insulating layer between the first capacitor electrode and the second capacitor electrode. Optionally, the array substrate includes a semiconductor material layer on a base substrate; a node connecting line in a same layer as the respective one of the plurality of voltage supply lines, connected to the first capacitor electrode through a first via, and connected to the semiconductor material layer through a second via; and an interference preventing block in a same layer as the second capacitor electrode, the respective one of the plurality of voltage supply lines connected to the interference preventing block through a third via, the interference preventing block comprising a first arm and a second arm. Optionally, along the first direction, a portion of the node connecting line at a position connecting to the semiconductor material layer through the second via is spaced apart from a first adjacent data line by the first arm, and is spaced apart from a second adjacent data line by the second arm.

Figure 1:
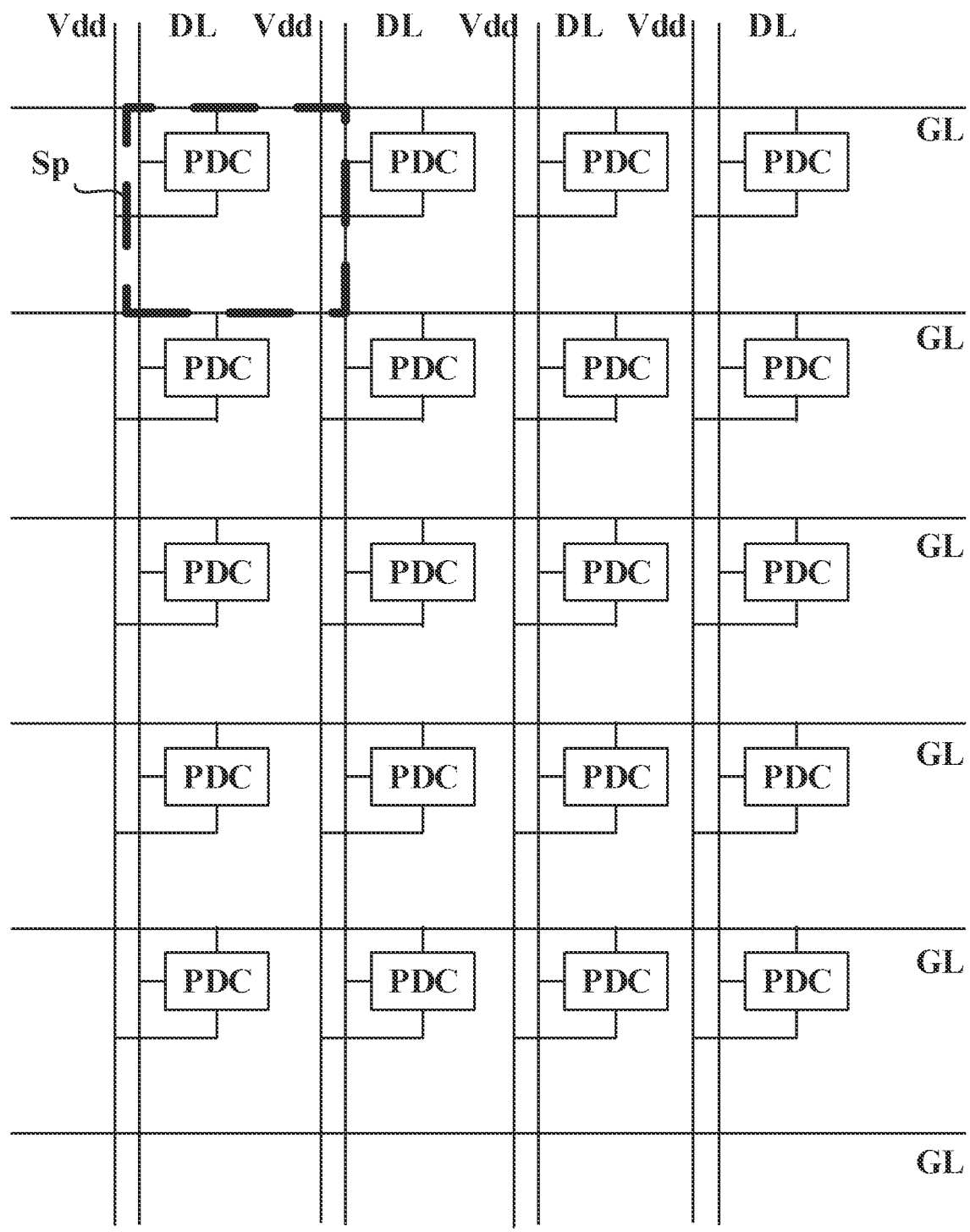
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a pixel driving circuit PDC. The array substrate includes a plurality of gate lines GL, a plurality of data lines DL, a plurality of voltage supply lines Vdd (e.g., high voltage supply lines), and a plurality of second voltage supply lines (e.g., low voltage supply lines Vss). Light emission in a respective one of the subpixels Sp is driven by a pixel driving circuit PDC. In one example, a high voltage signal (e.g., a VDD signal) is input, through a respective one of the plurality of voltage supply lines Vdd, to the pixel driving circuit PDC connected to an anode of the light emitting element; a low voltage signal (e.g., a VSS signal) is input, through a respective one of the plurality of second voltage supply lines (e.g., a low voltage supply line Vss), to a cathode of the light emitting element. A voltage difference between the high voltage signal (e.g., the VDD signal) and the low voltage signal (e.g., the VSS signal) is a driving voltage ΔV that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2A:
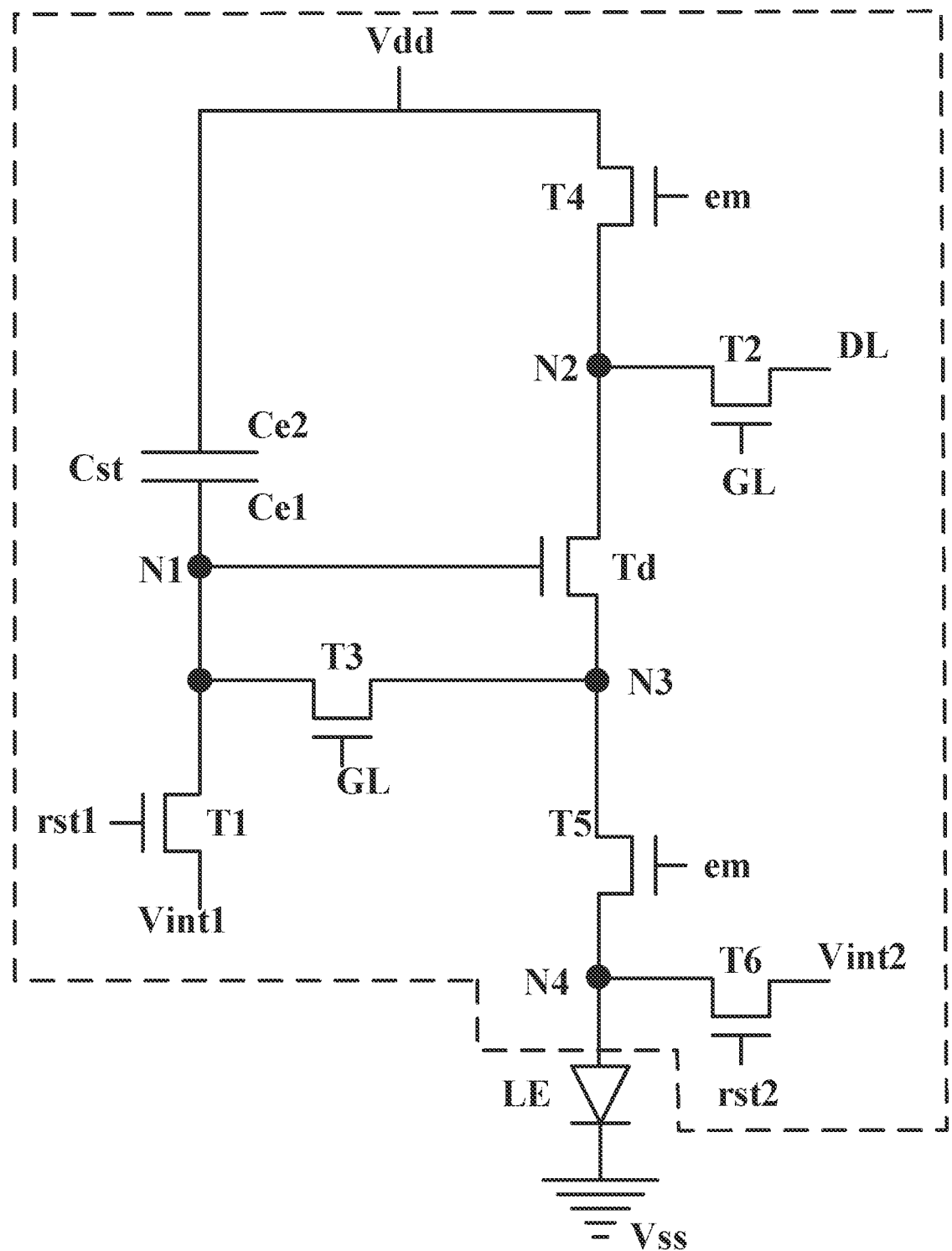
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a respective one of the plurality of first reset control signal lines rst1, a first electrode connected to a respective one of the plurality of first reset signal lines Vint1, and a second electrode connected to a first capacitor electrode Ce1 of the storage capacitor Cst and a gate electrode of the driving transistor Td; a second transistor T2 having a gate electrode connected to a gate line GL, a first electrode connected to the data line DL, and a second electrode connected to a first electrode of the driving transistor Td; a third transistor T3 having a gate electrode connected to the gate line GL, a first electrode connected to the first capacitor electrode Ce1 of the storage capacitor Cst and the gate electrode of the driving transistor Td, and a second electrode connected to a second electrode of the driving transistor Td; a fourth transistor T4 having a gate electrode connected to a respective one of the plurality of light emitting control signal lines em, a first electrode connected to the voltage supply line Vdd, and a second electrode connected to the first electrode of the driving transistor Td and the second electrode of the second transistor T2; a fifth transistor T5 having a gate electrode connected to the respective one of the plurality of light emitting control signal lines em, a first electrode connected to second electrodes of the driving transistor Td and the third transistor T3, and a second electrode connected to an anode of a light emitting element LE; and a sixth transistor T6 having a gate electrode connected to a respective one of the plurality of second reset control signal lines rst2, a first electrode connected to a respective one of the plurality of second reset signal lines Vint2, and a second electrode connected to the second electrode of the fifth transistor and the anode of the light emitting element LE. The second capacitor electrode Ce2 is connected to the voltage supply line Vdd and the first electrode of the fourth transistor T4. As used herein, the term "first electrode" refers to one of a source electrode and a drain electrode of a transistor, and the term "second electrode" refers to one of a source electrode and a drain electrode of a transistor. In one example, the first electrode is the source electrode, and the second electrode is the drain electrode. In another example, the first electrode is the drain electrode, and the second electrode is the source electrode.

The pixel driving circuit further include a first node N1, a second node N2, a third node N3, and a fourth node N4. The first node N1 is connected to the gate electrode of the driving transistor Td, the first capacitor electrode Ce1, and the first electrode of the third transistor T3. The second node N2 is connected to the second electrode of the fourth transistor T4, the second electrode of the second transistor T2, and the first electrode of the driving transistor Td. The third node N3 is connected to the second electrode of the driving transistor Td, the second electrode of the third transistor T3, and the first electrode of the fifth transistor T5. The fourth node N4 is connected to the second electrode of the fifth transistor T5, the second electrode of the sixth transistor T6, and the anode of the light emitting element LE.

Figure 2B:
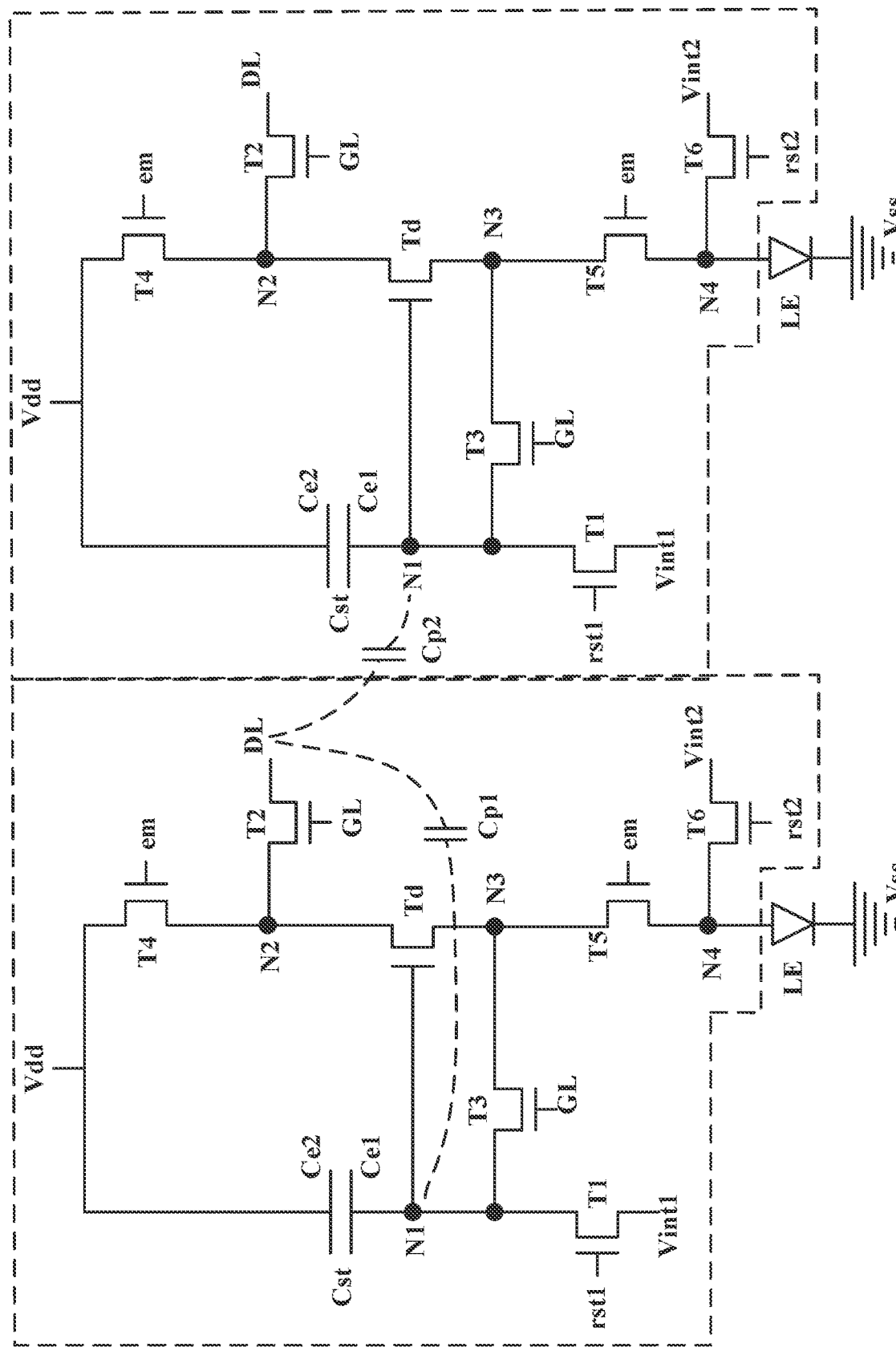
FIG. 2B illustrates a mechanism of preventing cross-talk in an array substrate in some embodiments according to the present disclosure.

FIG. 2B illustrates a mechanism of preventing cross-talk in an array substrate in some embodiments according to the present disclosure. Referring to FIG. 2B, the inventors of the present disclosure discover that presence of cross-talk between the N1 node and adjacent data lines affect display quality. The cross-talk between the N1 node and the adjacent data lines are indicated as parasitic capacitance Cp1 and Cp2 in FIG. 2B. The inventors of the present disclosure discover that, unexpected and surprisingly, an interference preventing block (which will be described in details in the present disclosure) can effectively reduce the cross-talk, particularly vertical cross-talk between the N1 node of the adjacent data lines.

Figure 3A:
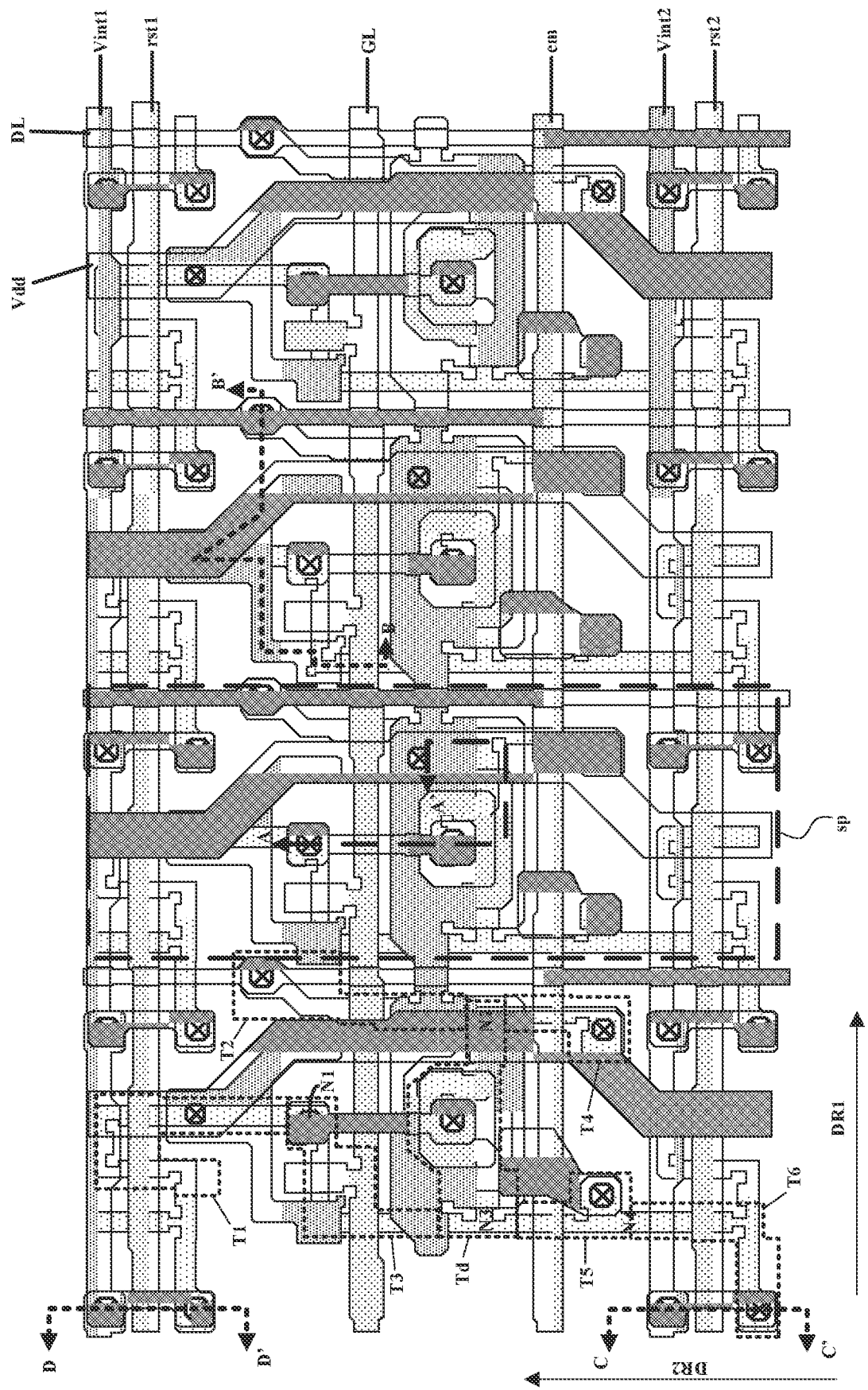
FIG. 3A is a diagram illustrating the structure of a plurality of subpixels of an array substrate in some embodiments according to the present disclosure.

FIG. 3A is a diagram illustrating the structure of a plurality of subpixels of an array substrate in some embodiments according to the present disclosure. Referring to FIG. 3A, the array substrate in some embodiments includes a plurality of subpixels (e.g., a red subpixel, a green subpixel, and a blue subpixel). The array substrate in some embodiments includes a plurality of gate lines GL respectively extending along a first direction DR1, a plurality of data lines DL respectively extending along a second direction DR2; and a plurality of voltage supply lines Vdd respectively extending along the second direction DR2. Optionally, the array substrate further includes a plurality of first reset control signal lines rst1 respectively extending along the first direction DR1; a plurality of second reset control signal lines rst2 respectively extending along the first direction DR1; a plurality of first reset signal lines Vint1 respectively extending along the first direction DR1; a plurality of second reset signal lines Vint2 respectively extending along the first direction DR1; and a plurality of light emitting control signal lines em respectively extending along the first direction DR1. Corresponding positions of the plurality of transistors in a pixel driving circuit are depicted in FIG. 3A. The pixel driving circuit includes the first transistor T1, the second transistor T2, the third transistor T3, the fourth transistor T4, the fifth transistor T5, the sixth transistor T6, and the driving transistor Td.

Figure 3B:
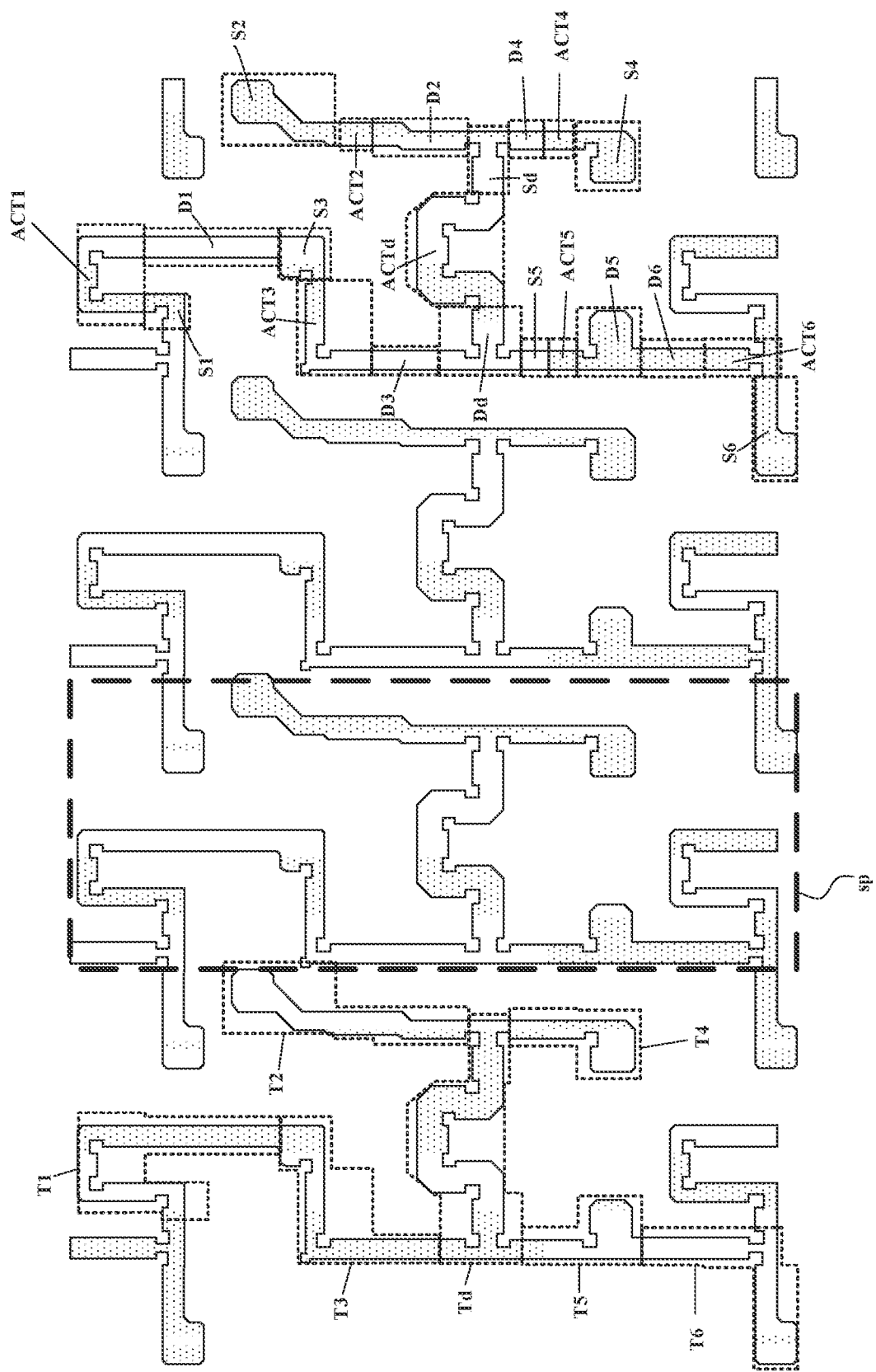
FIG. 3B is a diagram illustrating the structure of a semiconductor material layer in a plurality of subpixels of an array substrate depicted in FIG. 3A.
Figure 3C:
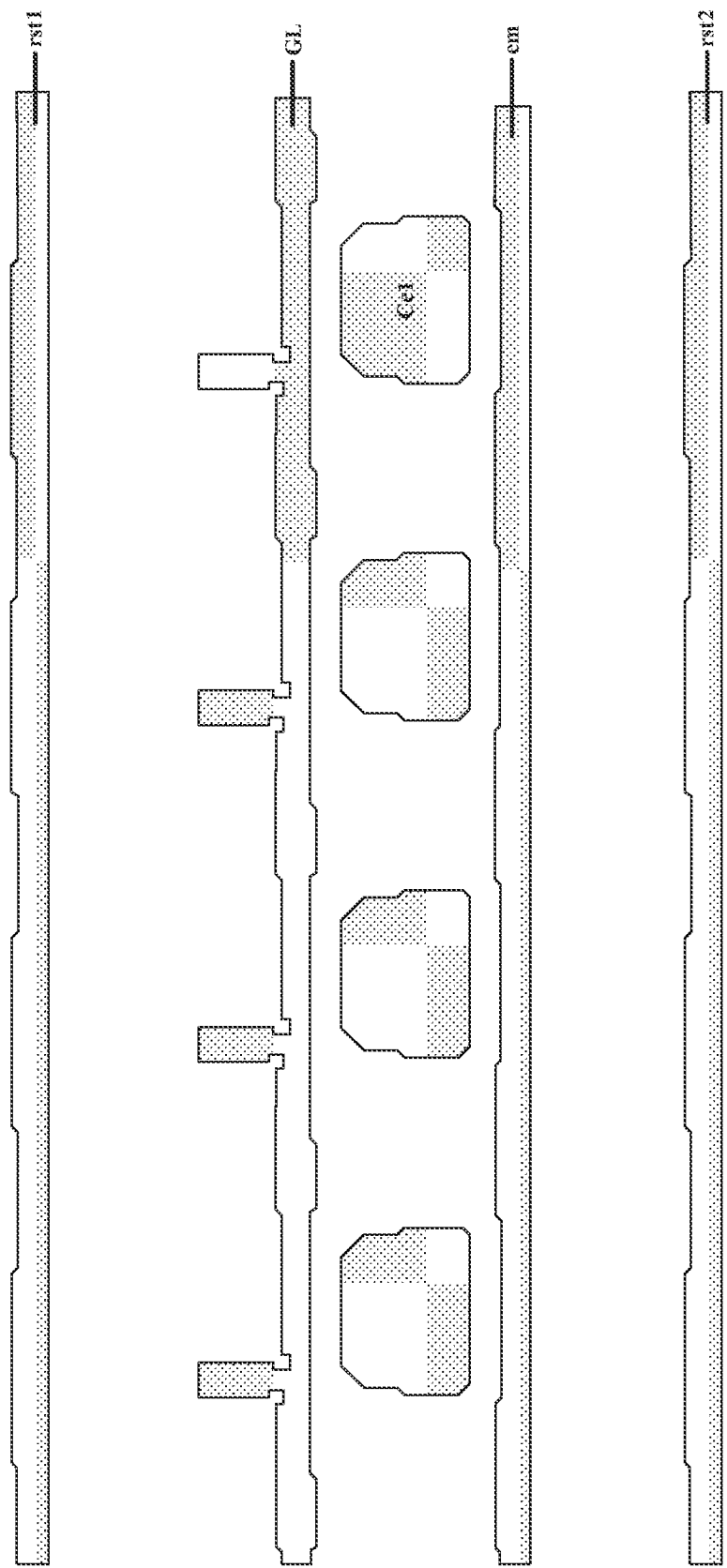
FIG. 3C is a diagram illustrating the structure of a first conductive layer in a plurality of subpixels of an array substrate depicted in FIG. 3A.
Figure 3D:
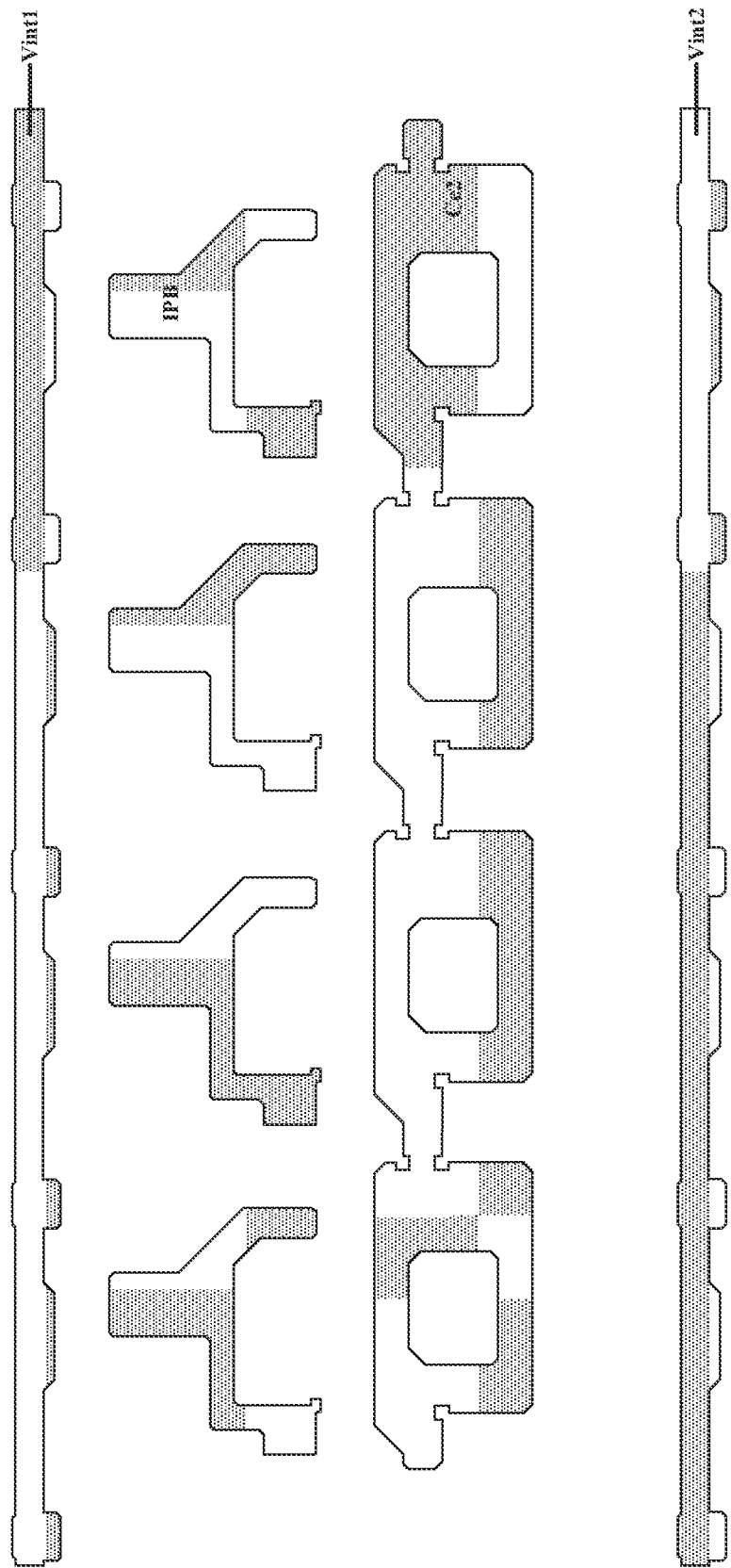
FIG. 3D is a diagram illustrating the structure of a second conductive layer in a plurality of subpixels of an array substrate depicted in FIG. 3A.
Figure 3E:
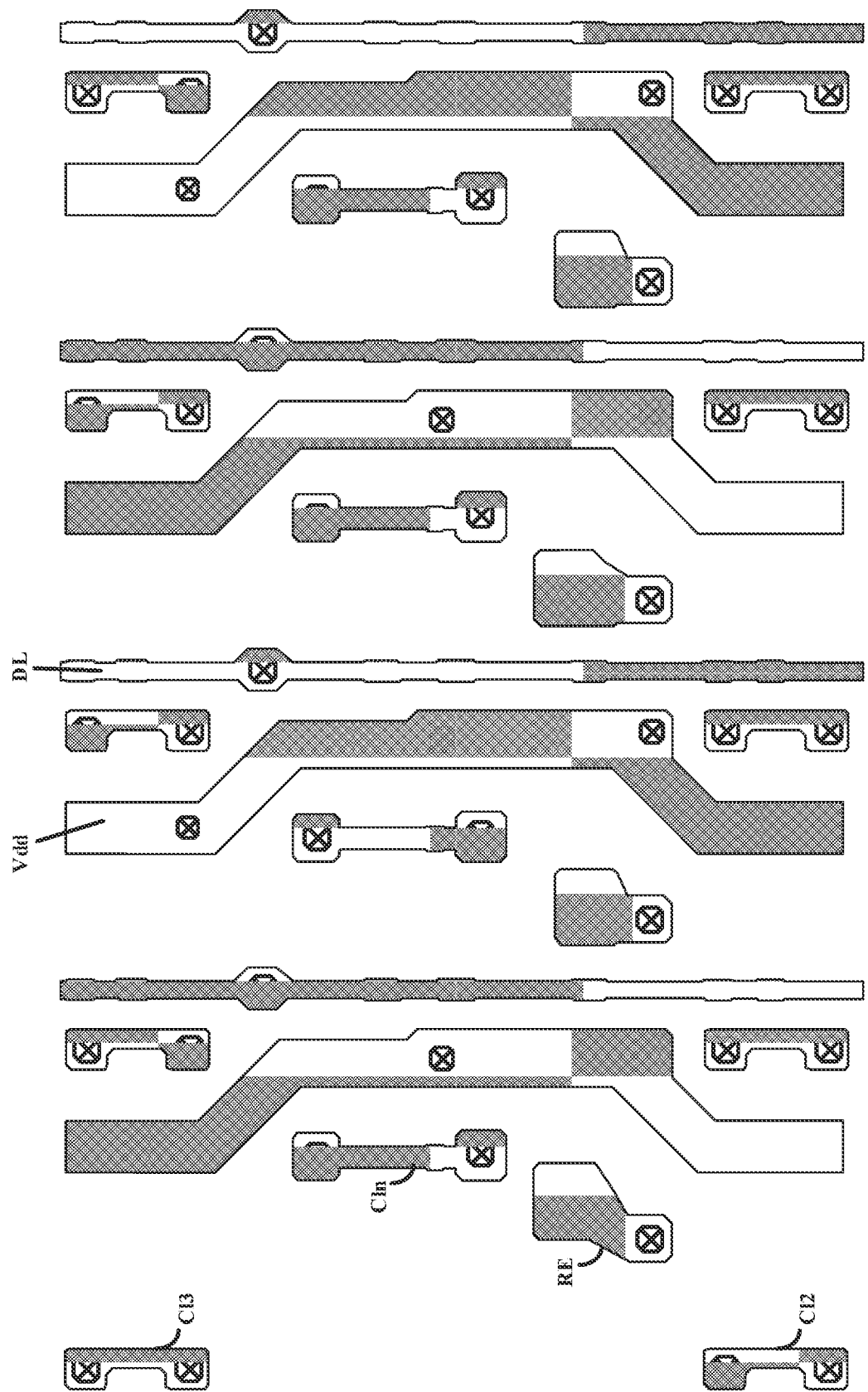
FIG. 3E is a diagram illustrating the structure of a signal line layer in a plurality of subpixels of an array substrate depicted in FIG. 3A.
Figure 4A:
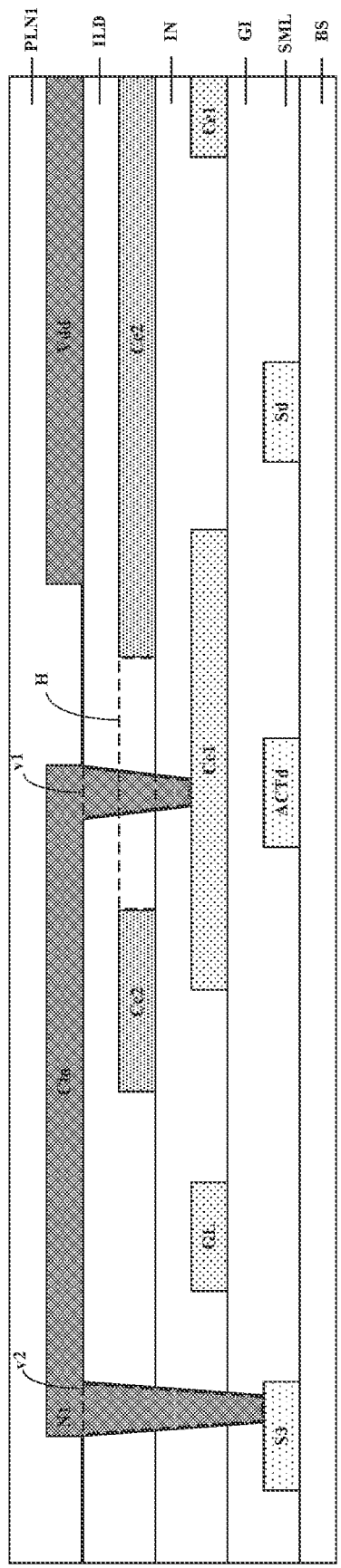
FIG. 4A is a cross-sectional view along an A-A' line in FIG. 3A.
Figure 4B:
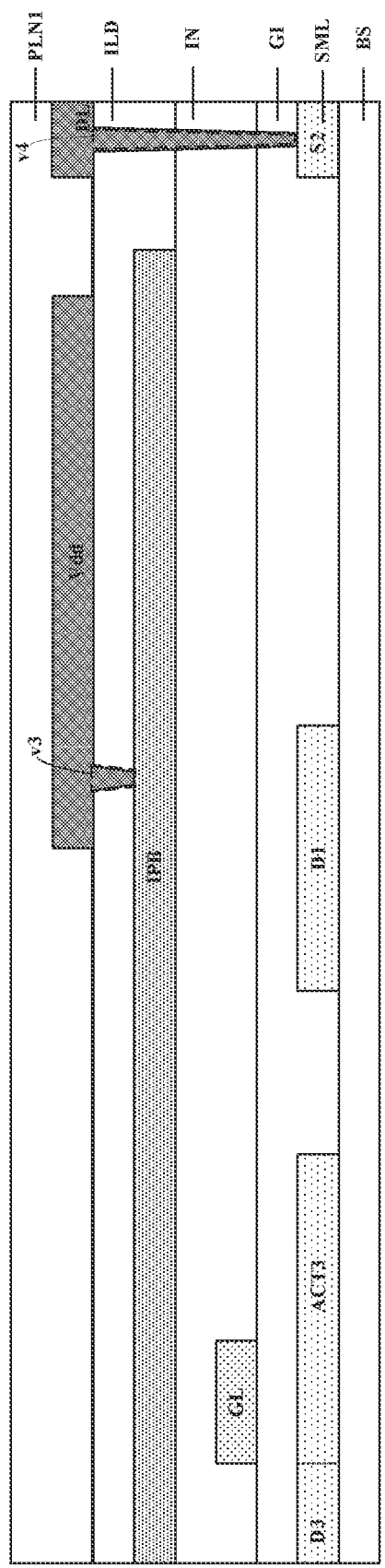
FIG. 4B is a cross-sectional view along a B-B' line in FIG. 3A.

FIG. 3B is a diagram illustrating the structure of a semiconductor material layer in a plurality of subpixels of an array substrate depicted in FIG. 3A. FIG. 3C is a diagram illustrating the structure of a first conductive layer in a plurality of subpixels of an array substrate depicted in FIG. 3A. FIG. 3D is a diagram illustrating the structure of a second conductive layer in a plurality of subpixels of an array substrate depicted in FIG. 3A. FIG. 3E is a diagram illustrating the structure of a signal line layer in a plurality of subpixels of an array substrate depicted in FIG. 3A. FIG. 4A is a cross-sectional view along an A-A' line in FIG. 3A. FIG. 4B is a cross-sectional view along a B-B' line in FIG. 3A. Referring to FIG. 3A to FIG. 3E, and FIG. 4A to FIG. 4B, in some embodiments, the array substrate includes a base substrate BS, a semiconductor material layer SML on the base substrate BS, a gate insulating layer GI on a side of the semiconductor material layer SML away from the base substrate BS, a first conductive layer on a side of the gate insulating layer GI away from the semiconductor material layer SML, an insulating layer IN on a side of the first conductive layer away from the gate insulating layer GI, a second conductive layer on a side of the insulating layer IN away from the first conductive layer, an inter-layer dielectric layer ILD on a side of the second conductive layer away from the insulating layer IN, a signal line layer on a side of the inter-layer dielectric layer ILD away from the second conductive layer, a first planarization layer PLN1 on a side of the signal line layer away from the inter-layer dielectric layer ILD.

Referring to FIG. 2A, FIG. 3A, and FIG. 3B, in some embodiments, in each subpixel, the semiconductor material layer has a unitary structure. In FIG. 3B, the first subpixel on the left is annotated with labels indicating regions corresponding to the plurality of transistors in the pixel driving circuit, including the first transistor T1, the second transistor T2, the third transistor T3, the fourth transistor T4, the fifth transistor T5, the sixth transistor T6, and the driving transistor Td. In FIG. 3B, the subpixel on the right is annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The driving transistor Td includes an active layer ACTd, a first electrode Sd, and a second electrode Dd. In one example, the active layers (ACT1, ACT2, ACT3, ACT4, ACT5, ACT6 and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in a respective subpixel are parts of a unitary structure in the respective subpixel. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) are in a same layer.

Referring to FIG. 2A, FIG. 3A, FIG. 3C, FIG. 4A, and FIG. 4B, the first conductive layer in some embodiments includes a plurality of gate lines GL, a plurality of first reset control signal lines rst1, a plurality of light emitting control signal lines em, a plurality of second reset control signal lines rst2, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of first reset control signal lines rst1, the plurality of light emitting control signal lines em, the plurality of second reset control signal lines rst2, and the first capacitor electrode Ce1 are in a same layer. Optionally, the first conductive layer has a thickness in a range of 200 nm to 300 nm, e.g., 250 nm.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Referring to FIG. 2A, FIG. 3A, and FIG. 3D, the second conductive layer in some embodiments includes a plurality of first reset signal lines Vint1, a second capacitor electrode Ce2 of the storage capacitor Cst, an interference preventing block IPB, and a plurality of second reset signal lines Vint2. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines Vint1, the plurality of second reset signal lines Vint2, the interference preventing block IPB, and the second capacitor electrode Ce2 are in a same layer. Optionally, the second conductive layer has a thickness in a range of 200 nm to 300 nm, e.g., 250 nm.

Referring to FIG. 2A, FIG. 3A, FIG. 3B, and FIG. 3E, the signal line layer in some embodiments includes a plurality of voltage supply lines Vdd, a plurality of data lines DL, a node connecting line Cln, a second connecting line Cl2, and a third connecting line Cl3. The node connecting line Cln connects the first capacitor electrode Ce1 and the first electrode of the third transistor T3 in a respective subpixel together. The second connecting line Cl2 connects a respective one of the plurality of second reset signal lines Vint2 and the first electrode of the sixth transistor T6 in a respective subpixel together. The third connecting line Cl3 connects a respective one of the plurality of first reset signal lines Vint1 and the first electrode of the first transistor T1 in a respective subpixel together. The first signal line layer in some embodiments further includes a relay electrode RE in a respective one of the plurality of subpixels sp. The relay electrode connects a first electrode of the fifth transistor T5 in the respective one of the plurality of subpixels sp to an anode contact pad in the respective one of the plurality of subpixels sp. Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the plurality of data lines DL, the node connecting line Cln, the second connecting line Cl2, and the third connecting line Cl3 are in a same layer. Optionally, the signal line layer has a thickness in a range of 600 nm to 700 nm, e.g., 650 nm.

In the context of the present disclosure, for example, in FIG. 3A, the area circled by dotted lines and denoted as "sp" indicates an approximate area corresponding to a respective subpixel in the array substrate. The area circled by dotted lines and denoted as "sp" does not necessarily indicates a repeating unit of the plurality of pixel driving circuits.

Figure 3F:
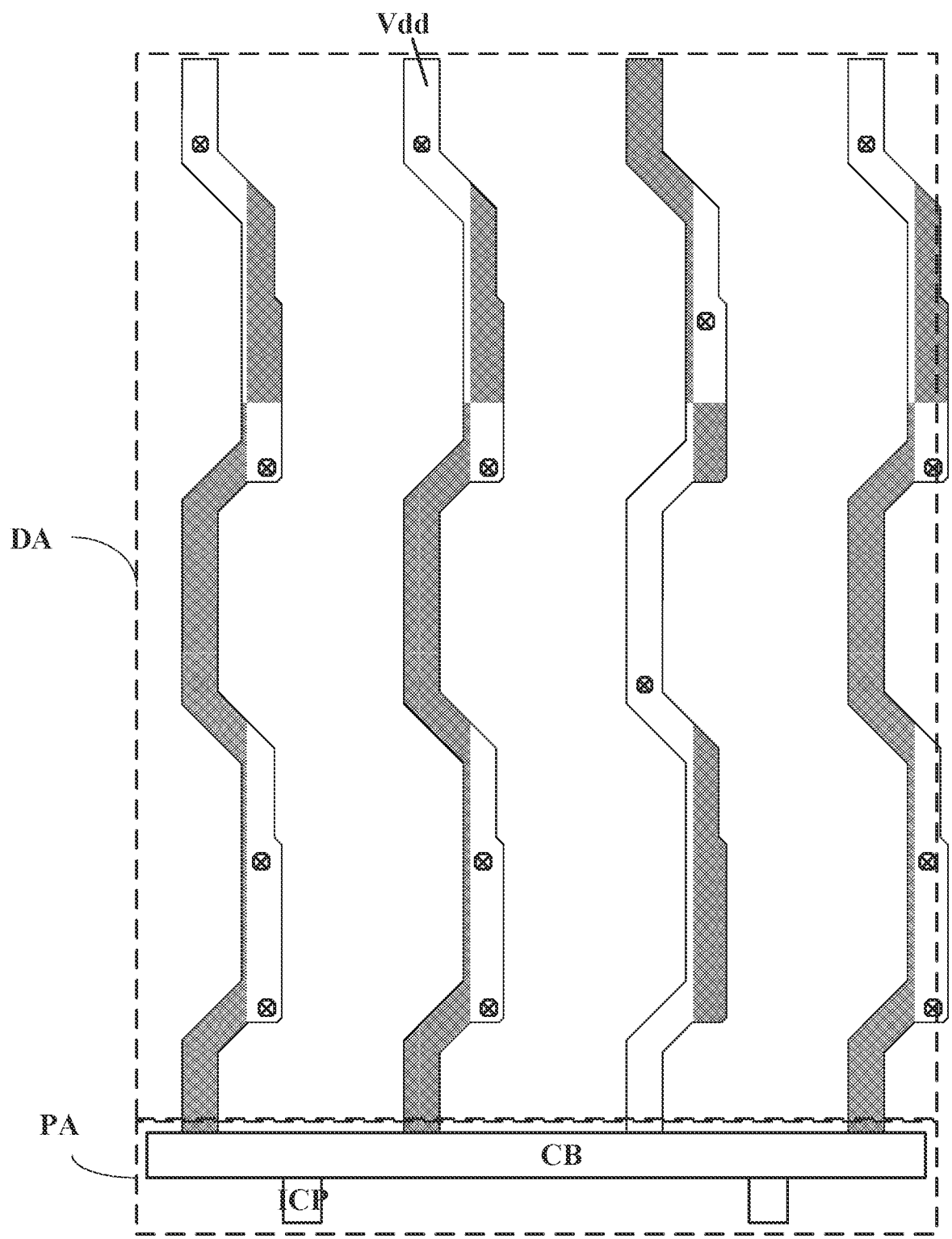
FIG. 3F is a diagram illustrating the structure of a plurality of voltage supply lines in an array substrate in some embodiments according to the present disclosure.

FIG. 3F is a diagram illustrating the structure of a plurality of voltage supply lines in an array substrate in some embodiments according to the present disclosure. In some embodiments, the array substrate includes a display area DA and a peripheral area PA. The plurality of voltage supply lines Vdd are at least partially in the display area DA. The plurality of voltage supply lines Vdd are connected to a connecting bar CB in the peripheral area PA. The connecting bar CB is in turn connected to a circuit connecting portion ICP which is then connected to, e.g., an integrated circuit.

Figure 4C:
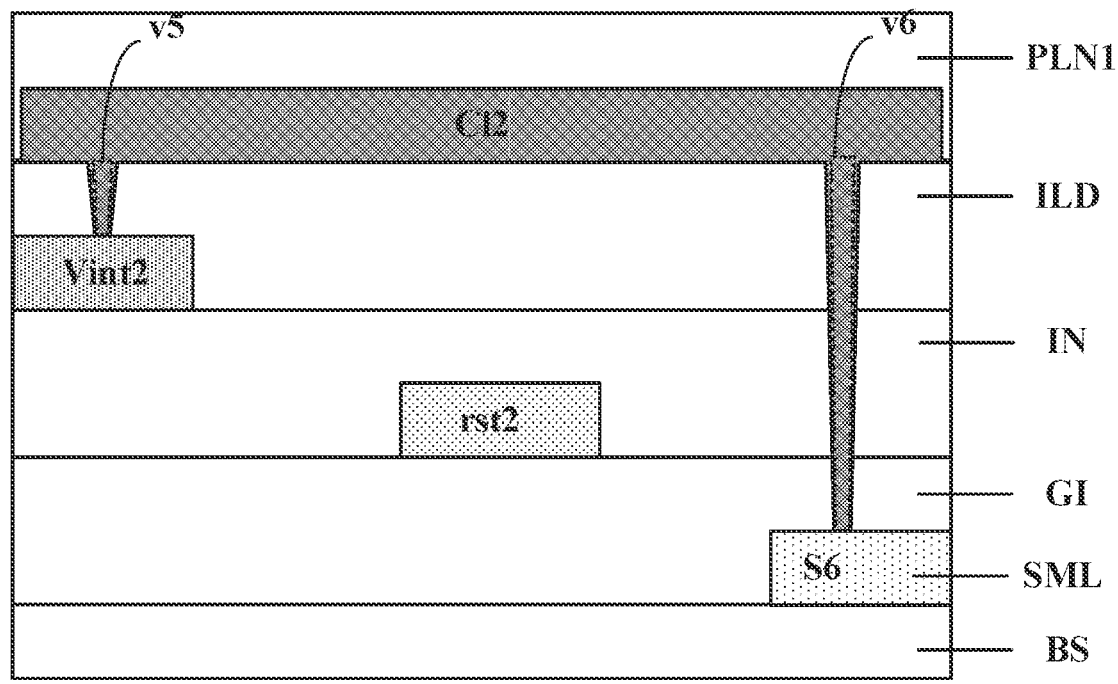
FIG. 4C is a cross-sectional view along a C-C' line in FIG. 3A.

FIG. 4C is a cross-sectional view along a C-C' line in FIG. 3A. Referring to FIG. 2A, FIG. 3A, FIG. 3E, and FIG. 4C, in some embodiments, the second connecting line Cl2 connects the respective one of the plurality of second reset signal lines Vint2 and the first electrode S6 of the sixth transistor T6 in a respective subpixel together. The respective one of the plurality of second reset signal lines Vint2 is configured to provide a reset signal to the first electrode S6 of the sixth transistor T6 in the respective subpixel, through the second connecting line Cl2. Optionally, the second connecting line Cl2 is connected to the respective one of the plurality of second reset signal lines Vint2 through a fifth via v5 extending through the inter-layer dielectric layer ILD. Optionally, the second connecting line Cl2 is connected to the first electrode S6 of the sixth transistor T6 in the respective subpixel through a sixth via v6 extending through the inter-layer dielectric layer ILD, the insulating layer IN, and the gate insulating layer GI.

Figure 4D:
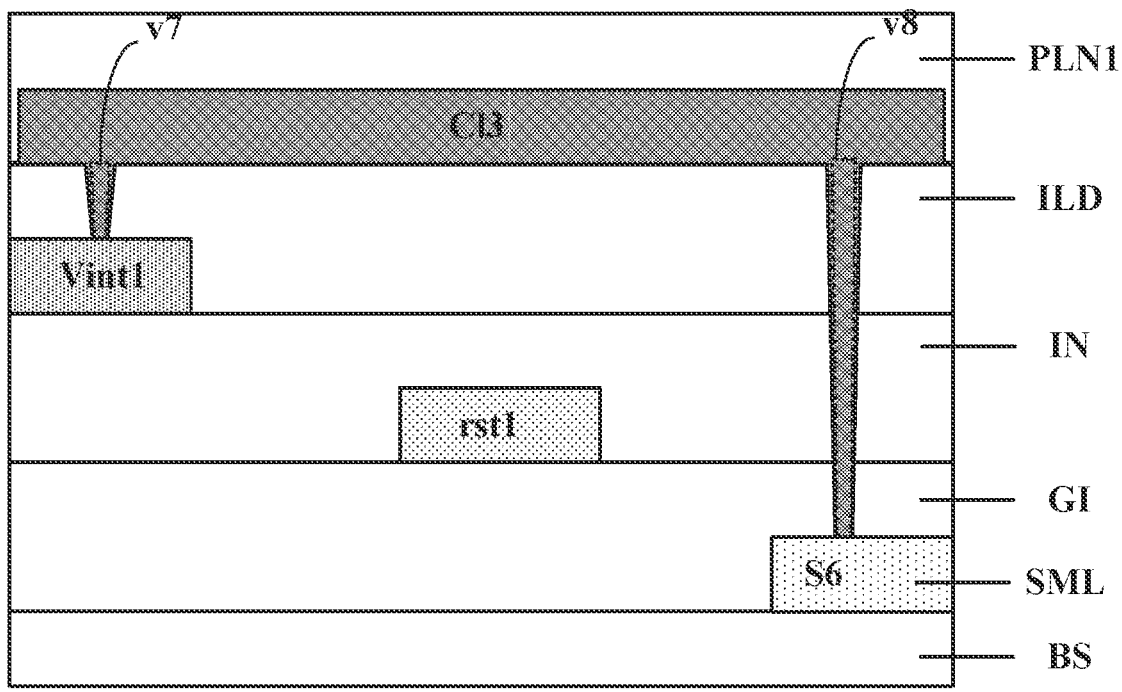
FIG. 4D is a cross-sectional view along a D-D' line in FIG. 3A.

FIG. 4D is a cross-sectional view along a D-D' line in FIG. 3A. Referring to FIG. 2A, FIG. 3A, FIG. 3E, and FIG. 4D, in some embodiments, the third connecting line Cl3 connects the respective one of the plurality of first reset signal lines Vint1 and the first electrode S1 of the first transistor T1 in a respective subpixel together. The respective one of the plurality of first reset signal lines Vint1 is configured to provide a reset signal to the first electrode S1 of the first transistor T1 in the respective subpixel, through the third connecting line Cl3. Optionally, the third connecting line Cl3 is connected to the respective one of the plurality of first reset signal lines Vint1 through a seventh via v7 extending through the inter-layer dielectric layer ILD. Optionally, the third connecting line Cl3 is connected to the first electrode S6 of the sixth transistor T6 in the respective subpixel through an eighth via v8 extending through the inter-layer dielectric layer ILD, the insulating layer IN, and the gate insulating layer GI.

Referring to FIG. 2A, FIG. 3A, FIG. 3C, FIG. 3D, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the signal line layer includes a node connecting line Cln on a side of the inter-layer dielectric layer ILD away from the second capacitor electrode Ce2. The node connecting line Cln is in a same layer as the plurality of voltage supply lines Vdd and the plurality of data lines DL. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer IN away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and is connected node connecting line Cln is connected the semiconductor material layer SML through the second via v2. Optionally, the node connecting line Cln is connected to the first electrode S3 of third transistor, as depicted in FIG. 4A.

Referring to Referring to FIG. 2A, FIG. 3A, FIG. 3D, and FIG. 4B, in some embodiments, the interference preventing block IPB is in a same layer as the second capacitor electrode Ce2. The respective one of the plurality of voltage supply lines Vdd is connected to the interference preventing block IPB through a third via v3. Optionally, the third via v3 extends through the inter-layer dielectric layer ILD.

Referring to Referring to FIG. 2A, FIG. 3A, FIG. 3D, and FIG. 4B, in some embodiments, the plurality of data lines DL are in a same layer as the plurality of voltage supply lines Vdd. A respective one of the plurality of data lines DL is connected to a first electrode S2 of the second transistor through a fourth via v4. Optionally, the fourth via v4 extends through the inter-layer dielectric layer ILD, the insulating layer IN, and the gate insulating layer GI.

Figure 5A:
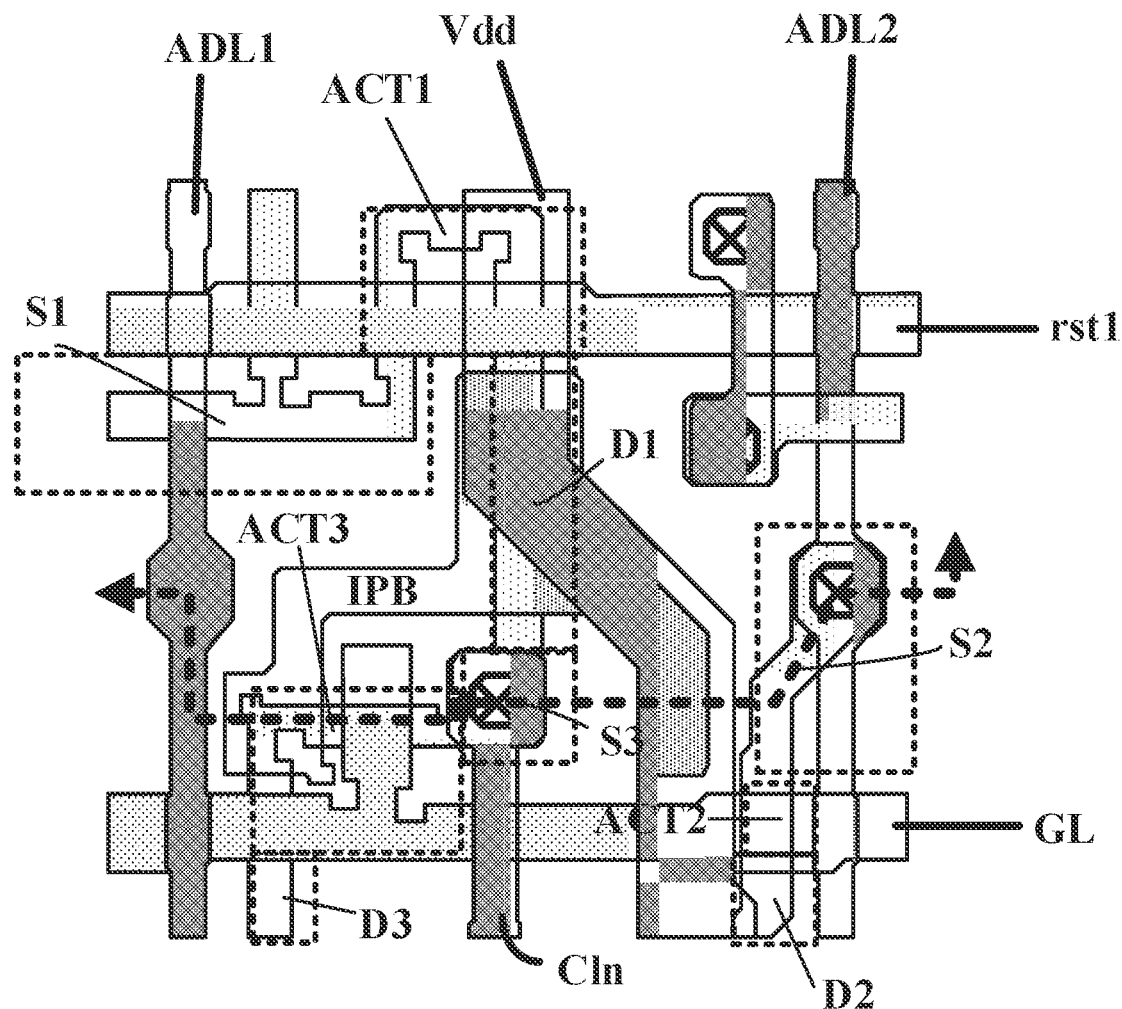
FIG. 5A is a partial view of a subpixel of an array substrate depicted in FIG. 3A.
Figure 5B:
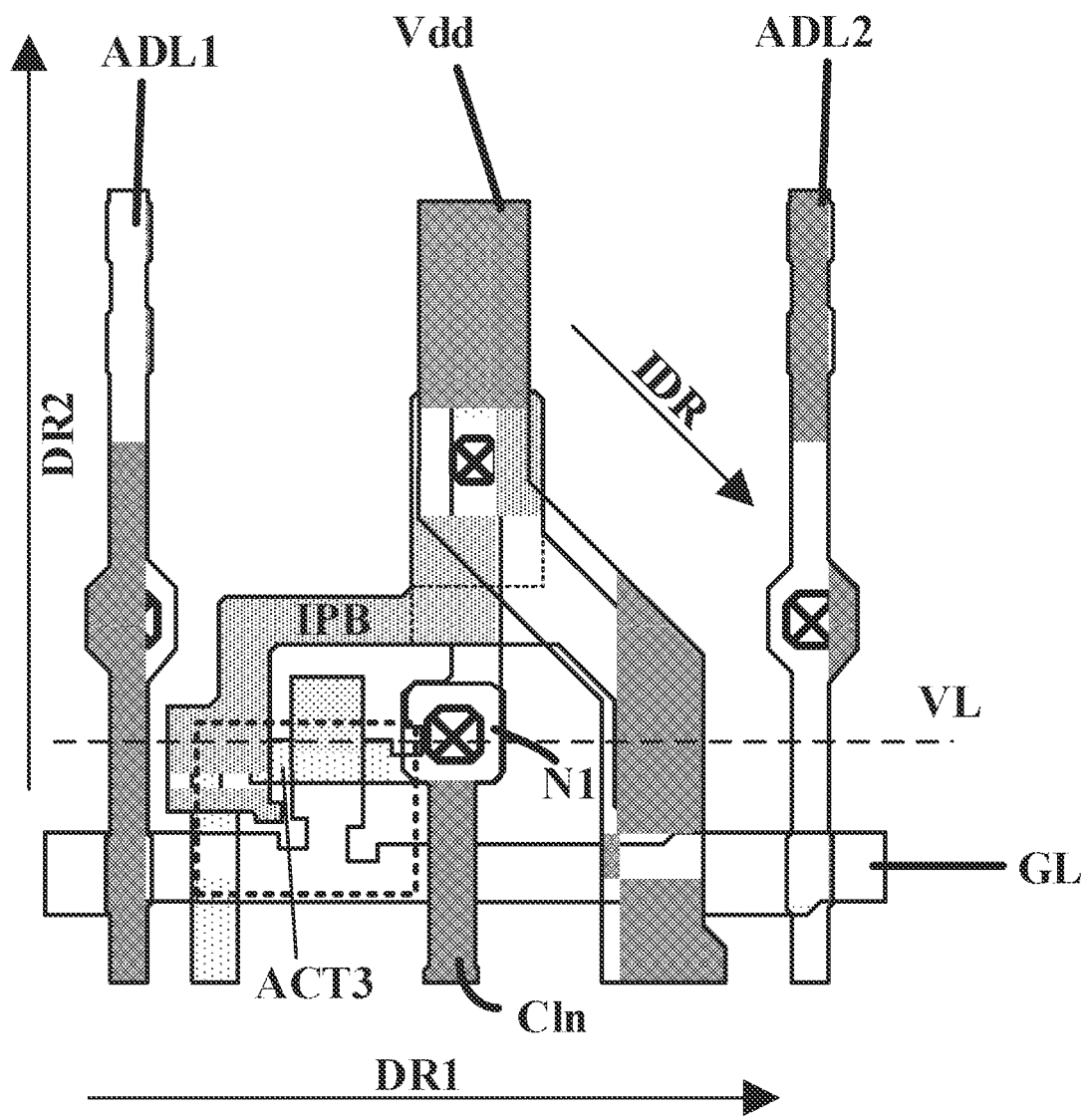
FIG. 5B show certain selected components of FIG. 5A.
Figure 5C:
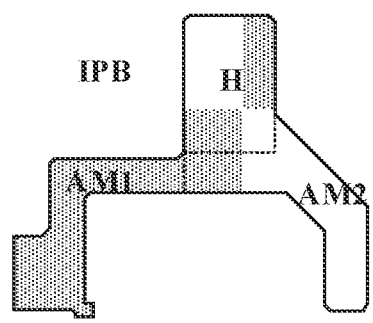
FIG. 5C illustrates the structure of an interference preventing block in some embodiments according to the present disclosure.

FIG. 5A is a partial view of a subpixel of an array substrate depicted in FIG. 3A. FIG. 5B show certain selected components of FIG. 5A. FIG. 5C illustrates the structure of an interference preventing block in some embodiments according to the present disclosure. Referring to FIG. 3A, FIG. 5A, FIG. 5B, and FIG. 5C, the interference preventing block IPB in some embodiments includes a first arm AM1 and a second arm AM2. As shown in FIG. 4A and FIG. 5B, a portion of the node connecting line Cn at a position connecting to the semiconductor material layer SML through the second via v2 may be denoted as the N1 node. Referring to FIG. 3A, FIG. 5A, and FIG. 5B, along the first direction DR1, the portion (e.g., the N1 node) of the node connecting line Cn at a position connecting to the semiconductor material layer SML through the second via v2 is spaced apart from a first adjacent data line ADL1 by the first arm AM1, and is spaced apart from a second adjacent data line ADL2 by the second arm AM2.

The inventors of the present disclosure discover that, unexpectedly and surprisingly, cross-talk between the N1 node and the adjacent data lines can be significantly reduced by having the interference preventing block IPB as described in the present disclosure. Table 1 below illustrates the unexpected and surprising reduction of cross-talk in an array substrate according to the present disclosure comparing to a control array substrate.

TABLE 1

Reduction of cross-talk between N1 node and adjacent data lines in an array substrate.

| | | An array substrate of the present disclosure | Control array substrate |
|---|---|---|---|
| Capacitance (fF) | N1 node~DL | 0.084 | 0.21 |
| | Cst | 40.65 | 38.06 |
| | Vdd~DL | 5.142 | 3.827 |
| | DL~N2 node | 0.113 | 0.116 |
| Crosstalk (under condition of a black data voltage of 6.5 V) | Vertical cross-talk | 0.672% | 1.630% |
| | Horizontal cross-talk | 0.832% | 0.838% |

In Table 1, "N1 node-DL" denotes a parasitic capacitance between the N1 node and an adjacent data line; "Cst" denotes the storage capacitance; "Vdd-DL" denotes a parasitic capacitance between a respective one of the plurality of voltage supply lines Vdd and an adjacent data line; "DL~N2 node" denotes a parasitic capacitance between the N2 node and an adjacent data line. The cross-talk data is measured under a condition of a black data voltage of 6.5 V provided to the plurality of data lines. As shown in Table 1, while the Vdd-DL increases with the interference preventing block IPB, the cross-talk (in particular the vertical cross-talk) can be significantly reduced, greatly improving display quality in a display panel having the present array substrate. Optionally, the vertical cross-talk is reduced, comparing the control array substrate, by at least 50%, e.g., at least 52%, at least 54%, at least 56%, at least 58%, or at least 60%. Optionally, the parasitic capacitance between the N1 node and an adjacent data line is reduced by at least 50%, e.g., at least 52%, at least 54%, at least 56%, at least 58%, or at least 60%. The slightly increased Vdd-DL can be easily compensated by a compensating integrated circuit.

Referring to FIG. 3A and FIG. 3B, in some embodiments, a first electrode S2 and an active layer ACT3 of the third transistor T3 are parts of a unitary structure in a respective one of a plurality of subpixels. Referring to FIG. 3A and FIG. 4A, in some embodiments, the node connecting line Cln is connected to the first electrode S3 of the third transistor T3 through the second via v2. Referring to FIG. 3A, FIG. 3B, FIG. 4A, and FIG. 5A to FIG. 5C, in some embodiments, an orthographic projection of the first arm AM1 on a base substrate BS at least partially overlaps with an orthographic projection of the active layer ACT3 of third transistor T3 on the base substrate BS.

As used herein, the active layer refers to a component of the transistor comprising at least a portion of the semiconductor material layer whose orthographic projection on the base substrate overlaps with an orthographic projection of a gate electrode on the base substrate. As used herein, a first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Figure 2C:
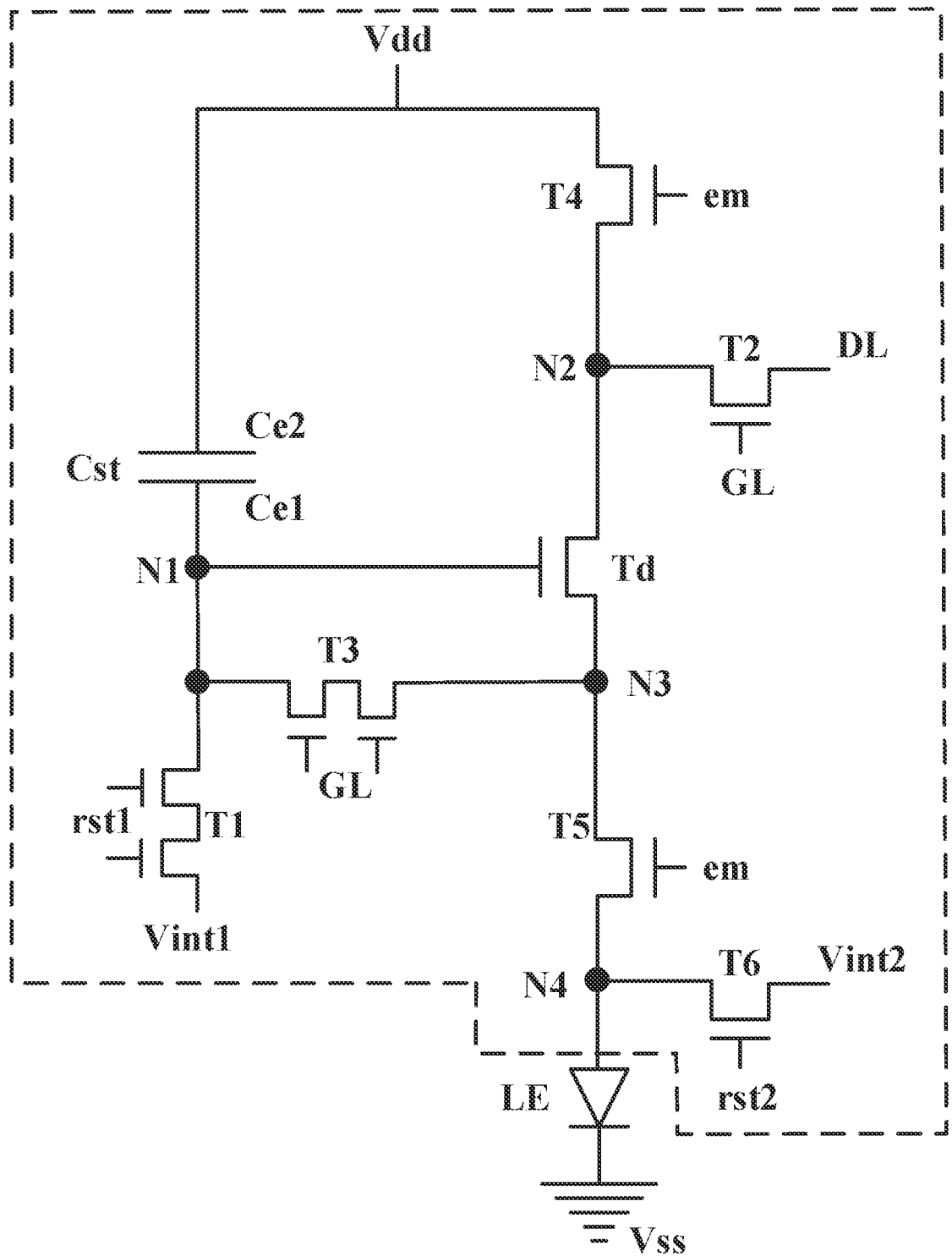
FIG. 2C is a circuit diagram illustrating the structure of a pixel driving circuit in some embodiments according to the present disclosure.
Figure 5D:
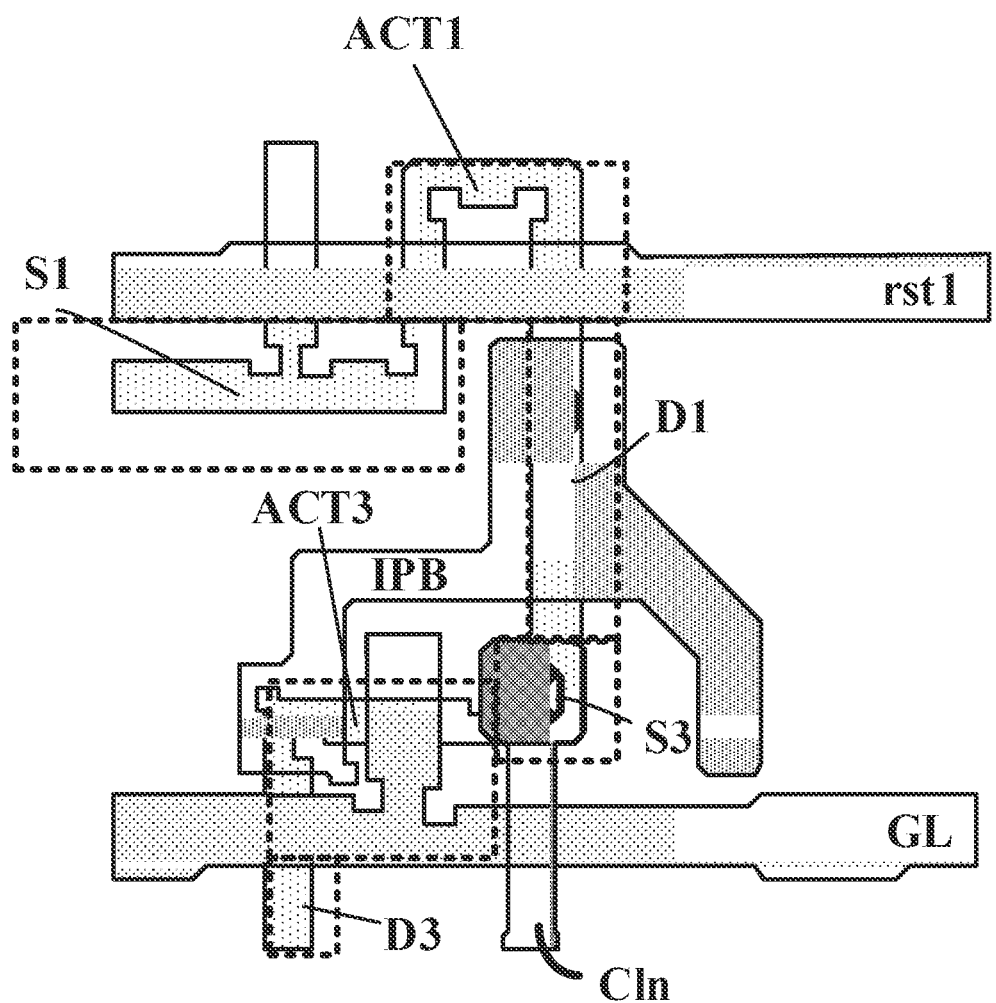
FIG. 5D is a zoom-in view of a region of an array substrate having a first transistor and a third transistor in some embodiments according to the present disclosure.
Figure 5E:
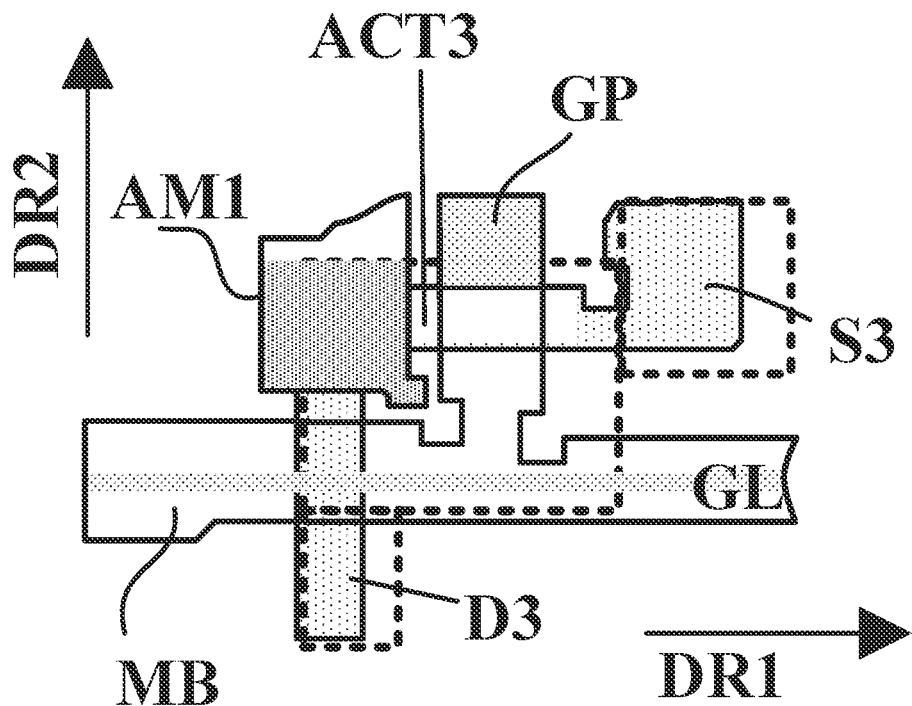
FIG. 5E is a further zoom-in view of a region of an array substrate having a third transistor in some embodiments according to the present disclosure.

FIG. 2C is a circuit diagram illustrating the structure of a pixel driving circuit in some embodiments according to the present disclosure. Referring to FIG. 2C, FIG. 3A, FIG. 3B, and FIG. 3C, in some embodiments, the third transistor T3 is a "double gate" transistor, and the first transistor T1 is a "double gate" transistor. FIG. 5D is a zoom-in view of a region of an array substrate having a first transistor and a third transistor in some embodiments according to the present disclosure. Referring to FIG. 5D, the active layer ACT1 of the first transistor T1 in some embodiments crosses over a respective one of the plurality of first reset control signal lines rst1 twice (alternatively, the respective one of the plurality of first reset control signal lines rst1 crosses over the active layer ACT1 of the first transistor T1 twice). Similarly, in some embodiments, the active layer ACT3 of the third transistor T3 in some embodiments crosses over a respective one of the plurality of gate lines GL twice (alternatively, the respective one of the plurality of gate lines GL crosses over the active layer ACT3 of the third transistor T3 twice). FIG. 5E is a further zoom-in view of a region of an array substrate having a third transistor in some embodiments according to the present disclosure. Referring to FIG. 5E, in some embodiments, the respective one of the plurality of gate lines GL includes a main body MB extending along the first direction DR1 and a protrusion GP protruding from the main body MB along the second direction DR2. As shown in FIG. 5E, the active layer ACT3 of the third transistor T3 crosses over the main body MB once and crosses over the protrusion GP once. The active layer ACT3 of the third transistor T3 includes a first portion that crosses over the protrusion GP, a second portion that crosses over the main body MB, and a third portion connecting the first portion and the second portion, the third portion does not crosses over any part of the respective one of the plurality of gate lines GL. As shown in FIG. 5E, the orthographic projection of the first arm AM1 on a base substrate at least partially overlaps with an orthographic projection of the third portion of the active layer ACT3 of third transistor T3 on the base substrate. Optionally, the third portion has a quasi L shape.

Referring to FIG. 3A, FIG. 3B, FIG. 4A, and FIG. 5A to FIG. 5C, in some embodiments, an orthographic projection of the second arm AM2 on a base substrate BS at least partially overlaps with an orthographic projection of a respective one of the plurality of voltage supply lines Vdd on the base substrate BS. Optionally, the orthographic projection of a respective one of the plurality of voltage supply lines Vdd on the base substrate BS substantially covers the orthographic projection of the second arm AM2 on a base substrate BS. As used herein, the term "substantially covers" refers to one orthographic projection being at least 50 percent, at least 60 percent, at least 70 percent, at least 80 percent, at least 90 percent, at least 95 percent, at least 99 percent, or 100 percent covered by another orthographic projection.

Figure 5F:
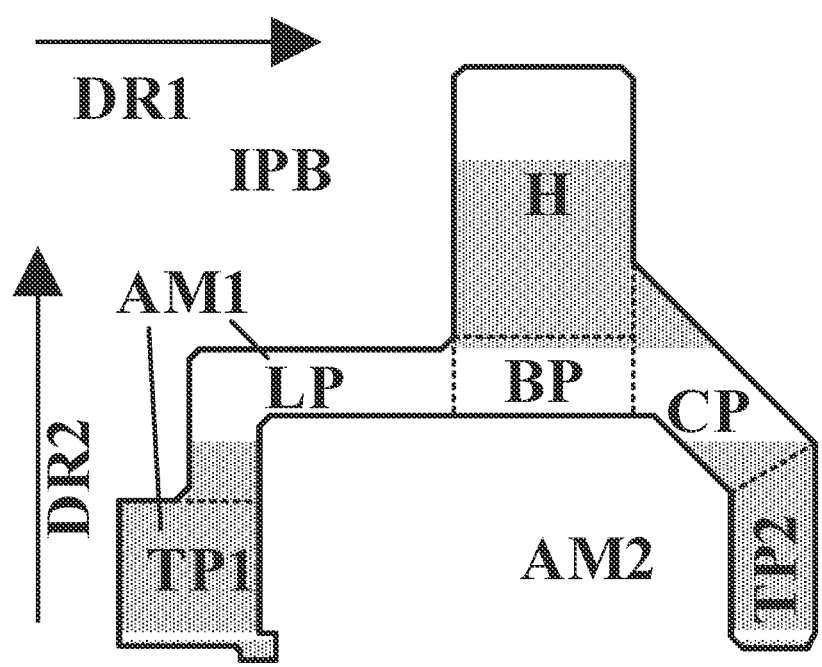
FIG. 5F illustrates a detailed structure of an interference preventing block in some embodiments according to the present disclosure.

FIG. 5F illustrates a detailed structure of an interference preventing block in some embodiments according to the present disclosure. Referring to FIG. 3A, FIG. 4B, FIG. 5A to FIG. 5E, the interference preventing block IPB in some embodiments further includes a handle H. The respective one of the plurality of voltage supply lines Vdd is connected to the handle H through the third via v3. Optionally, the first arm AM1 includes a L-shaped portion LP and a first tip portion TP1. Optionally, the second arm AM2 includes a base portion BP, a second tip portion TP2, and a connecting portion CP connecting the base portion BP and the second tip portion TP2. Optionally, the base portion BP connects the L-shaped portion LP and the handle H.

Optionally, the handle H has a substantially rectangular shape. Optionally, the base portion BP has a substantially rectangular shape. Optionally, the L-shaped portion has a quasi-L shape. Optionally, the first tip portion TP1 has a quasi rectangular shape.

Optionally, an orthographic projection of the first tip portion TP1 on a base substrate BS at least partially overlaps with an orthographic projection of the active layer ACT3 of third transistor T3 on the base substrate BS, whereas an orthographic projection of the L-shaped portion LP is non-overlapping with the orthographic projection of the active layer ACT3 of third transistor T3 on the base substrate BS.

Figure 5H:
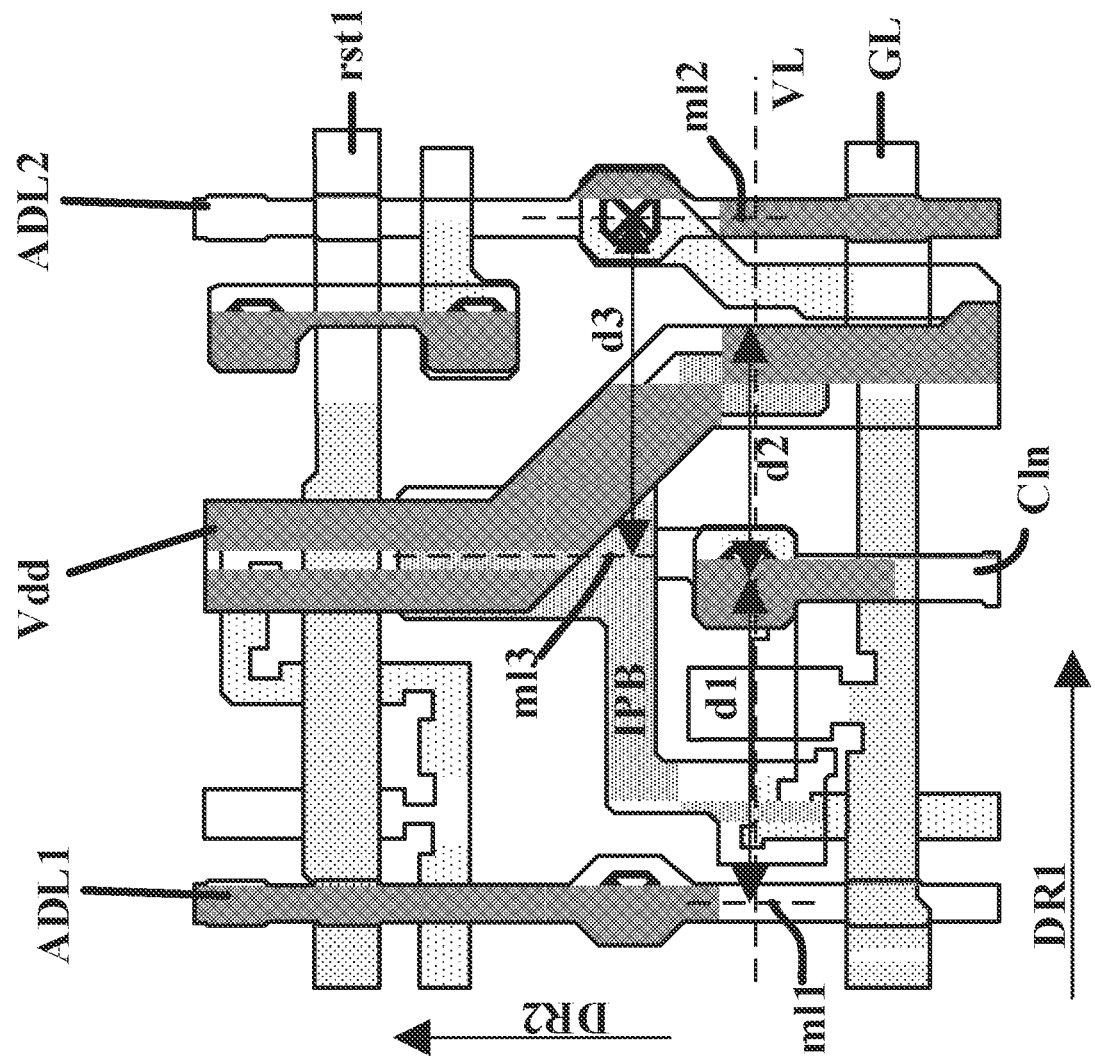
FIG. 5H illustrates structural relationships between an interference preventing block and surrounding components in some embodiments according to the present disclosure.
Figure 5G:
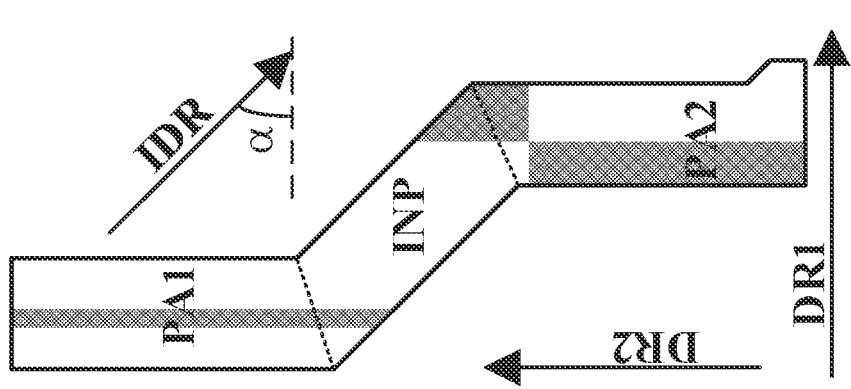
FIG. 5G illustrates a partial structure of a respective one of the plurality of voltage supply lines in some embodiments according to the present disclosure.

FIG. 5G illustrates a partial structure of a respective one of the plurality of voltage supply lines in some embodiments according to the present disclosure. Referring to FIG. 5G, a respective one of the plurality of voltage supply lines Vdd in some embodiments includes a first parallel portion PA1, a second parallel portion PA2, and an inclined portion INP connecting the first parallel portion PA1 and the second parallel portion PA2 along an inclined direction IDR. The first parallel portion PA1 and the second parallel portion PA2 respectively extend along a direction substantially parallel to the second direction DR2. The inclined portion INP extends along an inclined angle $\alpha$ with respect to the second direction DR2. The connecting portion INP extends along a direction substantially parallel to the inclined direction IDR. Referring to FIG. 5F, in some embodiments, the handle H and the base portion BP are arranged along a direction substantially parallel to the second direction DR2. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Optionally, each of the first parallel portion PA1, the second parallel portion PA2, and the inclined portion INP is a substantially straight. As used herein, the term "substantially straight" refers to either straight, or with minimum deviation from straight, for example, within 1%, within 2%, within 5%, within 7%, within 10%, within 12%, or within 15% deviating from straight.

Referring to FIG. 5A to FIG. 5G, in some embodiments, an orthographic projection of the inclined portion INP on a base substrate BS substantially covers an orthographic projection of the connecting portion CP on the base substrate BS. Optionally, an orthographic projection of the first parallel portion PA1 on the base substrate BS at least partially overlaps with an orthographic projection of the handle H on the base substrate BS.

Optionally, an orthographic projection of the second parallel portion PA2 on the base substrate BS substantially covers an orthographic projection of the second tip portion TP2 on the base substrate BS.

Referring to FIG. 2A, FIG. 3A, and FIG. 3B, in some embodiments, a second electrode D1 of the first transistor T1 and a first electrode S3 of the third transistor T3 are parts of a unitary structure in a respective one of a plurality of subpixels sp. The second electrode D1 of the first transistor T1 directly connected to the first electrode S3 of the third transistor T3. Referring to FIG. 4A, the node connecting line Cln in some embodiments is connected to the first electrode S3 of the third transistor T3 through the second via v2. Referring to FIG. 3A, FIG. 4A, FIG. 5A to FIG. 5G, in some embodiments, an orthographic projection of the second electrode D1 of the first transistor T1 on a base substrate BS at least partially overlaps with an orthographic projection of the handle H on the base substrate BS, at least partially overlaps with an orthographic projection of the first parallel portion PA1 on the base substrate BS, and at least partially overlaps with an orthographic projection of the base portion BP on the base substrate BS.

Referring to FIG. 5D, in some embodiments, an orthographic projection of the interference preventing block IPB on the base substrate BS covers at least 30% (e.g., at least 35%, 45%, 50%, 55%, at least 60%, at least 65%, at least 70%, at least 75%, at least 80%, at least 85%, or at least 90%,) of the orthographic projection of the second electrode D1 of the first transistor T1 on the base substrate BS.

Referring to FIG. 3A, FIG. 4A, FIG. 5A to FIG. 5G, in some embodiments, an orthographic projection of the portion (e.g., the N1 node depicted FIG. 5B) of the node connecting line Cln at the position connecting to the semiconductor material layer SML through the second via v2 on a base substrate BS is substantially surrounded by a combination of an orthographic projection of the interference preventing block IPB on the base substrate BS and an orthographic projection of a respective one of the plurality of gate lines GL on the base substrate BS. Optionally, an orthographic projection of the interference preventing block IPB on the base substrate BS is surrounded by a combination of an orthographic projection of the first adjacent data line ADL1 on the base substrate BS, an orthographic projection of the second adjacent data line ADL2 on the base substrate BS, an orthographic projection of the respective one of the plurality of first reset control signal lines rst1 on the base substrate BS, and an orthographic projection of the respective one of the plurality of gate lines GL on the base substrate BS. As used herein the term "substantially surrounded" refers to at least 50% (e.g., at least 60%, at least 70%, at least 80%, at least 90%, at least 95%, at least 99%, and 100%) of a perimeter of an area is surrounded.

Referring to FIG. 5B, a virtual line VL crossing over the portion (e.g., the N1 node depicted FIG. 5B) of the node connecting line Cln at the position connecting to the semiconductor material layer through the second via and substantially parallel to the first direction DR1 also crosses over the interference preventing block IPB, the first adjacent data line ADL1, and the second adjacent data line ADL2. Referring to FIG. 5B to FIG. 5G, in some embodiments, the virtual line VL crosses over the active layer ACT3 of third transistor T3, the interference preventing block IPB, the first adjacent data line ADL1, and the second adjacent data line ADL2. Optionally, the virtual line VL crosses over the first tip portion TP1, the second tip portion TP2, the first adjacent data line ADL1, and the second adjacent data line ADL2.

FIG. 5H illustrates structural relationships between an interference preventing block and surrounding components in some embodiments according to the present disclosure. FIG. 5H shows a first shortest distance d1, along the virtual line VL, between the portion (e.g., the N1 node depicted FIG. 5B) of the node connecting line Cln at the position connecting to the semiconductor material layer through the second via and a first center line ml, along the second direction DR2, of the first adjacent data line ADL1. FIG. 5H further shows a second shortest distance d2, along the virtual line VL, between the portion (e.g., the N1 node depicted FIG. 5B) of the node connecting line Cln at the position connecting to the semiconductor material layer through the second via and an edge of the second parallel portion PA2 on a side closer to the second adjacent data line ADL2. FIG. 5H further shows a third shortest distance d3 between a second center line ml2, along the second direction DR2, of the second adjacent data line ADL2 and a third center line ml3, along the second direction DR2, of the handle H.

Optionally, the first shortest distance d1 is in a range of 10.0 μm to 20.0 μm, e.g., 10.0 μm to 12.5 μm, 12.5 μm to 15.0 μm, 15.0 μm to 17.5 μm, or 17.5 μm to 20.0 μm. Optionally, the first shortest distance d1 is in a range of 14.5 μm to 16.5 μm, e.g., 14.5 μm to 15.0 μm, 15.0 μm to 15.5 μm, 15.5 μm to 16.0 μm, or 16.0 μm to 16.5 μm. Optionally, the second shortest distance d2 is in a range of 8.0 μm to 18.0 μm, e.g., 8.0 μm to 10.5 μm, 10.5 μm to 13.0 μm, 13.0 μm to 15.5 μm, or 15.5 μm to 18.0 μm. Optionally, the second shortest distance d2 is in a range of 12.5 μm to 14.5 μm, e.g., 12.5 μm to 13.0 μm, 13.0 μm to 13.5 μm, 13.5 μm to 14.0 μm, or 14.0 μm to 14.5 μm. Optionally, the third shortest distance d3 is in a range of 11.0 μm to 22.0 μm, e.g., 11.0 μm to 14.0 μm, 14.0 μm to 17.0 μm, 17.0 μm to 20.0 μm, or 20.0 μm to 22.0 μm. Optionally, the third shortest distance d3 is in a range of 16.0 μm to 18.0 μm, e.g., 16.0 μm to 16.5 μm, 16.5 μm to 17.0 μm, 17.0 μm to 17.5 μm, or 17.5 μm to 18.0 μm. Optionally, the first shortest distance d1 is 15.53 μm, the second shortest distance d2 is 13.65 μm, and the third shortest distance d3 is 16.87 μm.

Optionally, a ratio among the first shortest distance, the second shortest distance, and the third shortest distance is in a range of (14.5 to 16.5):(13.5 to 14.5):(16.0 to 18.0).

Figure 5I:
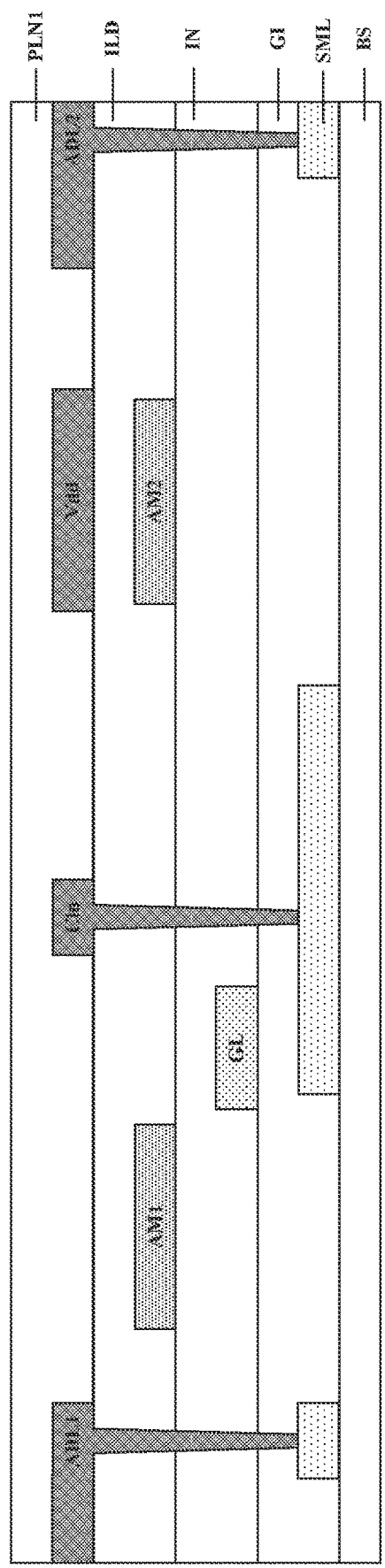
FIG. 5I is a cross-sectional view along an E-E' line in FIG. 5A.

FIG. 5I is a cross-sectional view along an E-E' line in FIG. 5A. Referring to FIG. 5I, along the first direction, a portion of the node connecting line Cln at a position connecting to the semiconductor material layer SML through the second via v2 is spaced apart from a first adjacent data line ADL1 by the first arm AM1, and is spaced apart from a second adjacent data line ADL2 by the second arm AM2.

In another aspect, the present disclosure provides a display panel including the array substrate described herein or fabricated by a method described herein, and a counter substrate facing the array substrate. Optionally, the display panel is an organic light emitting diode display panel. Optionally, the display panel is micro light emitting diode display panel.

In another aspect, the present invention provides a display apparatus, comprising the array substrate described herein or fabricated by a method described herein, and one or more integrated circuits connected to the array substrate.

In another aspect, the present invention provides a method of fabricating an array substrate. In some embodiments, the method includes forming a plurality of gate lines respectively extending along a first direction; forming a plurality of data lines respectively extending along a second direction; forming a plurality of voltage supply lines respectively extending along the second direction; and forming a pixel driving circuit. Optionally, forming the pixel driving circuit includes forming a driving transistor; forming a first transistor; forming a second transistor; forming a third transistor, and forming a storage capacitor. Optionally, forming the storage capacitor includes forming a first capacitor electrode, forming a second capacitor electrode electrically connected to a respective one of the plurality of voltage supply lines, and forming an insulating layer between the first capacitor electrode and the second capacitor electrode. Optionally, the method includes forming a semiconductor material layer on a base substrate; forming a node connecting line in a same layer as the respective one of the plurality of voltage supply lines, connected to the first capacitor electrode through a first via, and connected to the semiconductor material layer through a second via; and forming an interference preventing block in a same layer as the second capacitor electrode, the respective one of the plurality of voltage supply lines connected to the interference preventing block through a third via, the interference preventing block comprising a first arm and a second arm. Optionally, along the first direction, a portion of the node connecting line at a position connecting to the semiconductor material layer through the second via is spaced apart from a first adjacent data line by the first arm, and is spaced apart from a second adjacent data line by the second arm.

In some embodiments, a first electrode and an active layer of the third transistor are formed as parts of a unitary structure in a respective one of a plurality of subpixels. Optionally, the node connecting line is formed to be connected to the first electrode of the third transistor through the second via. Optionally, an orthographic projection of the first arm on a base substrate at least partially overlaps with an orthographic projection of the active layer of third transistor on the base substrate. Optionally, an orthographic projection of the second arm on a base substrate at least partially overlaps with an orthographic projection of a respective one of the plurality of voltage supply lines on the base substrate. Optionally, an orthographic projection of a respective one of the plurality of voltage supply lines on the base substrate substantially covers an orthographic projection of the second arm on the base substrate.

In some embodiments, forming the interference preventing block further includes forming a handle. Optionally, the respective one of the plurality of voltage supply lines is formed to be connected to the handle through the third via. Optionally, forming the first arm includes forming a L-shaped portion and forming a first tip portion. Optionally, forming the second arm includes forming a base portion, forming a second tip portion, and forming a connecting portion connecting the base portion and the second tip portion. Optionally, the base portion is formed to connect the L-shaped portion and the handle.

In some embodiments, a first electrode and an active layer of the third transistor are formed as parts of a unitary structure in a respective one of a plurality of subpixels. Optionally, the node connecting line is formed to be connected to the first electrode of the third transistor through the second via. Optionally, an orthographic projection of the first tip portion on a base substrate at least partially overlaps with an orthographic projection of the active layer of third transistor on the base substrate.

In some embodiments, forming a respective one of the plurality of voltage supply lines includes a first parallel portion, a second parallel portion, and an inclined portion connecting the first parallel portion and the second parallel portion along an inclined direction. Optionally, the first parallel portion and the second parallel portion are formed to respectively extend along a direction substantially parallel to the second direction. Optionally, the inclined portion is formed to extend along an inclined angle with respect to the second direction. Optionally, the handle and the base portion are formed to be arranged along a direction substantially parallel to the second direction. Optionally, the connecting portion is formed to extend along a direction substantially parallel to the inclined direction.

In some embodiments, an orthographic projection of the inclined portion on a base substrate substantially covers an orthographic projection of the connecting portion on the base substrate. Optionally, an orthographic projection of the first parallel portion on the base substrate at least partially overlaps with an orthographic projection of the handle on the base substrate. Optionally, an orthographic projection of the second parallel portion on the base substrate substantially covers an orthographic projection of the second tip portion on the base substrate.

In some embodiments, a second electrode of the first transistor and a first electrode of the third transistor are formed as parts of a unitary structure in a respective one of a plurality of subpixels, the second electrode of the first transistor directly connected to the first electrode of the third transistor. Optionally, the node connecting line is formed to be connected to the first electrode of the third transistor through the second via. Optionally, an orthographic projection of the second electrode of the first transistor on a base substrate at least partially overlaps with an orthographic projection of the handle on the base substrate, at least partially overlaps with an orthographic projection of the first parallel portion on the base substrate, and at least partially overlaps with an orthographic projection of the base portion on the base substrate. Optionally, an orthographic projection of the portion of the node connecting line at the position connecting to the semiconductor material layer through the second via on a base substrate is substantially surrounded by a combination of an orthographic projection of the interference preventing block on the base substrate and an orthographic projection of a respective one of the plurality of gate lines on the base substrate.

In some embodiments, the method further includes forming a plurality of first reset control signal lines. Optionally, a portion of a respective one of the plurality of first reset control signal lines functions as a gate electrode of the first transistor. Optionally, a second electrode of the first transistor and a first electrode of the third transistor are formed as parts of a unitary structure in a respective one of a plurality of subpixels, the second electrode of the first transistor directly connected to the first electrode of the third transistor. Optionally, the node connecting line is formed to be connected to the first electrode of the third transistor through the second via. Optionally, a portion of a respective one of the plurality of gate lines functions as a gate electrode of the third transistor. Optionally, an orthographic projection of the interference preventing block on the base substrate is surrounded by a combination of an orthographic projection of the first adjacent data line on the base substrate, an orthographic projection of the second adjacent data line on the base substrate, an orthographic projection of the respective one of the plurality of first reset control signal lines on the base substrate, and an orthographic projection of the respective one of the plurality of gate lines on the base substrate.

In some embodiments, a virtual line crossing over the portion of the node connecting line at the position connecting to the semiconductor material layer through the second via and substantially parallel to the first direction also crosses over the interference preventing block, the first adjacent data line, and the second adjacent data line. Optionally, a virtual line crossing over the portion of the node connecting line at the position connecting to the semiconductor material layer through the second via and substantially parallel to the first direction also crosses over the active layer of third transistor, the interference preventing block, the first adjacent data line, and the second adjacent data line. Optionally, a virtual line crossing over the portion of the node connecting line at the position connecting to the semiconductor material layer through the second via and substantially parallel to the first direction also crosses over the first tip portion, the second tip portion, the first adjacent data line, and the second adjacent data line.

In some embodiments, a first shortest distance, along the virtual line, between the portion of the node connecting line at the position connecting to the semiconductor material layer through the second via and a first center line along the second direction of the first adjacent data line is in a range of 14.5 µm to 16.5 µm. Optionally, a second shortest distance, along the virtual line, between the portion of the node connecting line at the position connecting to the semiconductor material layer through the second via and an edge of the second parallel portion on a side closer to the second adjacent data line is in a range of 12.5 µm to 14.5 µm. Optionally, a third shortest distance between a second center line along the second direction of the second adjacent data line and a third center line along the second direction of the handle is in a range of 16.0 µm to 18.0 µm. Optionally, a ratio among the first shortest distance, the second shortest distance, and the third shortest distance is in a range of (14.5 to 16.5):(13.5 to 14.5):(16.0 to 18.0).

In some embodiments, the method further includes forming agate insulating layer on a side of the semiconductor material layer away from a base substrate, the first capacitor electrode being on a side of the gate insulating layer away from the base substrate; and forming an inter-layer dielectric layer on a side of the second capacitor electrode away from the insulating layer, the node connecting line and the plurality of voltage supply lines being on a side of the inter-layer dielectric layer away from the second capacitor electrode. Optionally, the first via is formed in a hole region in which a portion of the second capacitor electrode is absent, and extends through the inter-layer dielectric layer and the insulating layer, wherein an orthographic projection of the second capacitor electrode on a base substrate completely covers, with a margin, an orthographic projection of the first capacitor electrode on the base substrate except for the hole region. Optionally, the second via extends through the inter-layer dielectric layer, the insulating layer, and the gate insulating layer.

Various appropriate insulating materials and various appropriate fabricating methods may be used to make a buffer layer and a barrier layer (between the semiconductor material layer and the base substrate), For example, an insulating material may be deposited on the substrate by a plasma-enhanced chemical vapor deposition (PECVD) process. Examples of materials suitable for making the buffer layer and/or the barrier layer include, but are not limited to, silicon oxide (SiOx), silicon nitride (SiNx), or a combination thereof. Optionally, the thickness of the buffer layer is in a range of 400 nm to 800 nm, e.g., 600 nm. Optionally, the thickness of the barrier layer is in a range of 80 nm to 150 nm, e.g., 110 nm.

Various appropriate semiconductor materials and various appropriate fabricating methods may be used to make the semiconductor material layer. For example, a semiconductor material may be deposited on the substrate by magnetron sputtering, vapor deposition (e.g., plasma-enhanced chemical vapor deposition), or vacuum deposition. Examples of appropriate metal oxide semiconductor materials include, but are not limited to, polycrystalline silicon, amorphous silicon, and various metal oxides such as indium gallium tin oxide, indium gallium zinc oxide, zinc oxide, gallium oxide, indium oxide. In one example, the semiconductor material layer includes polycrystalline silicon. Optionally, the thickness of the semiconductor material layer is in a range of approximately 45 nm to approximately 55 nm, e.g., 50 nm.

Various appropriate insulating materials and various appropriate fabricating methods may be used to make the gate insulating layer, the insulating layer, the inter-layer dielectric layer, or the planarization layer. For example, an insulating material may be deposited on the substrate by a plasma-enhanced chemical vapor deposition (PECVD) process. Examples of materials suitable for making the gate insulating layer, the insulating layer, the inter-layer dielectric layer, or the planarization layer include, but are not limited to, silicon oxide (SiOx), silicon nitride (SiNx), or a combination thereof. Optionally, the gate insulating layer has a thickness in a range of 100 nm to 140 nm, e.g., 120 nm. Optionally, the insulating layer has a thickness in a range of 100 nm to 160 nm, e.g., 130 nm. Optionally, the inter-layer dielectric layer has a thickness in a range of 450 nm to 550 nm, e.g., 500 nm. Optionally, the planarization layer has a thickness in a range of 1200 nm to 1800 nm, e.g., 1500 nm.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a pixel driving circuit;
wherein the pixel driving circuit comprises a driving transistor; a first transistor; a second transistor; a third transistor, a fourth transistor, a fifth transistor, a sixth transistor, and a storage capacitor;
wherein a gate electrode of the driving transistor is electrically connected to a first electrode of the third transistor, a second electrode of the first transistor, and a first capacitor electrode of the storage capacitor;

a first electrode of the driving transistor is electrically connected to a second electrode of the second transistor and a second electrode of the fourth transistor;

a second electrode of the driving transistor is electrically connected to a second electrode of the third transistor and a first electrode of the fifth transistor;

a second electrode of the fifth transistor is electrically connected to a second electrode of the sixth transistor; and a first electrode of the fourth transistor is electrically connected to a second capacitor electrode of the storage capacitor;

wherein the array substrate comprises:

a base substrate;

a semiconductor material layer on the base substrate;

a gate insulating layer on a side of the semiconductor material layer away from the base substrate;

a plurality of gate lines respectively extending along a first direction and the first capacitor electrode of the storage capacitor on a side of the gate insulating layer away from the base substrate;

an insulating layer on a side of the plurality of gate lines away from the base substrate;

an interference preventing block and the second capacitor electrode on a side of the insulating layer away from the base substrate;

an inter-layer dielectric layer on a side of the interference preventing block and the second capacitor electrode away from the base substrate; and a plurality of data lines respectively extending along a second direction, a plurality of voltage supply lines respectively extending along the second direction, a node connecting line on a side of the inter-layer dielectric layer away from the base substrate;

wherein the second capacitor electrode is electrically connected to a respective one of the plurality of voltage supply lines;

the node connecting line is connected to the first capacitor electrode through a first through hole, and connected to the first electrode of the third transistor through a second through hole; and the respective one of the plurality of voltage supply lines is connected to the interference preventing block through a third through hole, the interference preventing block comprising a first arm and a second arm;

wherein in a plan view of a virtual line parallel to the first direction, the virtual line intersects with the node connecting line at a position of the second through hole; and wherein, along the first direction of the plan view of the virtual line, a first adjacent data line, the first arm, the node connecting line at the position of the second through hole, the second arm, and a second adjacent data line are sequentially arranged.

2. The array substrate of claim 1, wherein a first electrode of the third transistor and a second electrode of the first transistor are parts of a unitary structure in a respective one of a plurality of subpixels;

the node connecting line is connected to the first electrode of the third transistor through the second through hole; and an orthographic projection of the first arm on a base substrate at least partially overlaps with an orthographic projection of an active layer of the third transistor on the base substrate.

3. The array substrate of claim 1, wherein an orthographic projection of the second arm on a base substrate at least partially overlaps with an orthographic projection of a respective one of the plurality of voltage supply lines on the base substrate.

4. The array substrate of claim 1, wherein an orthographic projection of a respective one of the plurality of voltage supply lines on the base substrate substantially covers at least 30% of an orthographic projection of the second arm on the base substrate.

5. The array substrate of claim 1, wherein the interference preventing block further comprises a handle;

the respective one of the plurality of voltage supply lines is connected to the handle through the third through hole;

the first arm comprises a L-shaped portion and a first tip portion; and the second arm comprises a base portion, a second tip portion, and a connecting portion connecting the base portion and the second tip portion;

wherein the base portion connects the L-shaped portion and the handle.

6. The array substrate of claim 5, wherein a first electrode and an active layer of the third transistor are parts of a unitary structure in a respective one of a plurality of subpixels;

the node connecting line is connected to the first electrode of the third transistor or to a second electrode of the first transistor through the second through hole; and an orthographic projection of the first tip portion on a base substrate at least partially overlaps with an orthographic projection of the active layer of third transistor on the base substrate.

7. The array substrate of claim 5, wherein a respective one of the plurality of voltage supply lines comprises a first parallel portion, a second parallel portion, and an inclined portion connecting the first parallel portion and the second parallel portion along an inclined direction;

the first parallel portion and the second parallel portion respectively extend along a direction substantially parallel to the second direction;

the inclined portion extends along an inclined angle with respect to the second direction;

the handle and the base portion are arranged along a direction substantially parallel to the second direction; and the connecting portion extends along a direction substantially parallel to the inclined direction.

8. The array substrate of claim 7, wherein an orthographic projection of the inclined portion on a base substrate substantially covers an orthographic projection of the connecting portion on the base substrate;

an orthographic projection of the first parallel portion on the base substrate at least partially overlaps with an orthographic projection of the handle on the base substrate; and an orthographic projection of the second parallel portion on the base substrate substantially covers an orthographic projection of the second tip portion on the base substrate.

9. The array substrate of claim 7, wherein a second electrode of the first transistor and a first electrode of the third transistor are parts of a unitary structure in a respective one of a plurality of subpixels, the second electrode of the first transistor directly connected to the first electrode of the third transistor;

the node connecting line is connected to the first electrode of the third transistor through the second through hole; and an orthographic projection of the second electrode of the first transistor on a base substrate at least partially overlaps with an orthographic projection of the handle on the base substrate, at least partially overlaps with an orthographic projection of the first parallel portion on the base substrate, and at least partially overlaps with an orthographic projection of the base portion on the base substrate.

10. The array substrate of claim 9, wherein an orthographic projection of the interference preventing block on the base substrate covers at least 50% of the orthographic projection of the second electrode of the first transistor on the base substrate.

11. The array substrate of claim 7, wherein the virtual line also crosses over the first tip portion, the second tip portion, the first adjacent data line, and the second adjacent data line; and
a first shortest distance, along the virtual line, between the node connecting line at the position of the second through hole and a first center line along the second direction of the first adjacent data line is in a range of 10.0 μm to 20.0 μm.

12. The array substrate of claim 11, wherein a second shortest distance, along the virtual line, between the node connecting line at the position of the second through hole and an edge of the second parallel portion on a side closer to the second adjacent data line is in a range of 8.0 μm to 18.0 μm.

13. The array substrate of claim 12, wherein a third shortest distance between a second center line along the second direction of the second adjacent data line and a third center line along the second direction of the handle is in a range of 11.0 μm to 22.0 μm.

14. The array substrate of claim 13, wherein a ratio among the first shortest distance, the second shortest distance, and the third shortest distance is in a range of (14.5 to 16.5):(13.5 to 14.5):(16.0 to 18.0).

15. The array substrate of claim 1, wherein an orthographic projection of the node connecting line at the position of the second through hole on a base substrate is substantially surrounded by a combination of an orthographic projection of the interference preventing block on the base substrate and an orthographic projection of a respective one of the plurality of gate lines on the base substrate.

16. The array substrate of claim 1, further comprising a plurality of first reset control signal lines;
a portion of a respective one of the plurality of first reset control signal lines functions as a gate electrode of the first transistor;
a second electrode of the first transistor and a first electrode of the third transistor are parts of a unitary structure in a respective one of a plurality of subpixels, the second electrode of the first transistor directly connected to the first electrode of the third transistor;
the node connecting line is connected to the first electrode of the third transistor through the second through hole;
a portion of a respective one of the plurality of gate lines functions as a gate electrode of the third transistor; and
an orthographic projection of the interference preventing block on the base substrate is surrounded by a combination of an orthographic projection of the first adjacent data line on the base substrate, an orthographic projection of the second adjacent data line on the base substrate, an orthographic projection of the respective one of the plurality of first reset control signal lines on the base substrate, and an orthographic projection of the respective one of the plurality of gate lines on the base substrate.

17. The array substrate of claim 1, wherein the second adjacent data line is configured provide a data signal to a respective subpixel; and
the first adjacent data line is configured to provide a data signal to an adjacent subpixel directly adjacent to the respective subpixel.

18. A display apparatus, comprising the array substrate of claim 1, and an integrated circuit connected to the array substrate.

* * * * *